United States Patent
Cheng et al.

(10) Patent No.: US 12,094,849 B2
(45) Date of Patent: Sep. 17, 2024

(54) ATOMIC LAYER DEPOSITION BONDING LAYER FOR JOINING TWO SEMICONDUCTOR DEVICES

(71) Applicant: Taiwan Semiconductor Manufacturing Company, Ltd., Hsinchu (TW)

(72) Inventors: Kuang-Wei Cheng, Hsinchu (TW); Chyi-Tsong Ni, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/443,186

(22) Filed: Jul. 22, 2021

(65) Prior Publication Data

US 2023/0026052 A1 Jan. 26, 2023

(51) Int. Cl.
*H01L 23/00* (2006.01)
*H01L 27/06* (2006.01)

(52) U.S. Cl.
CPC .............. *H01L 24/32* (2013.01); *H01L 24/27* (2013.01); *H01L 24/83* (2013.01); *H01L 27/0688* (2013.01); *H01L 2224/2745* (2013.01); *H01L 2224/27848* (2013.01); *H01L 2224/291* (2013.01); *H01L 2224/29188* (2013.01); *H01L 2224/2919* (2013.01); *H01L 2224/32145* (2013.01); *H01L 2224/83896* (2013.01)

(58) Field of Classification Search
None
See application file for complete search history.

(56) References Cited

U.S. PATENT DOCUMENTS

| | | | | |
|---|---|---|---|---|
| 5,013,681 A | * | 5/1991 | Godbey | G03F 1/22 438/459 |
| 6,326,285 B1 | * | 12/2001 | Behfar | H01L 21/76254 438/455 |
| 6,661,065 B2 | * | 12/2003 | Kunikiyo | H01L 29/513 257/E21.546 |
| 7,217,636 B1 | * | 5/2007 | Atanackovic | H01L 21/76254 438/455 |
| 8,278,735 B2 | * | 10/2012 | Hashim | C23C 14/083 257/532 |
| 8,822,817 B2 | | 9/2014 | Bhusari et al. | |

(Continued)

FOREIGN PATENT DOCUMENTS

| | | | | |
|---|---|---|---|---|
| CN | 104064574 A | * | 9/2014 | ......... H01L 21/2007 |
| CN | 102738248 B | * | 3/2015 | |

(Continued)

*Primary Examiner* — Telly D Green
(74) *Attorney, Agent, or Firm* — Harrity & Harrity, LLP

(57) ABSTRACT

A method may include forming a first atomic layer deposition (ALD) bonding layer on a surface of a first semiconductor device, and forming a second ALD bonding layer on a surface of a second semiconductor device. The method may include joining the first semiconductor device and the second semiconductor device via the first ALD bonding layer and the second ALD bonding layer. The method may include performing an annealing operation to fuse the first ALD bonding layer and the second ALD bonding layer and form a single ALD bonding layer that bonds the first semiconductor device with the second semiconductor device.

20 Claims, 17 Drawing Sheets

(56) References Cited

U.S. PATENT DOCUMENTS

| | | | | |
|---|---|---|---|---|
| 8,859,390 | B2* | 10/2014 | Farooq | H01L 25/0657 |
| | | | | 438/455 |
| 8,878,355 | B2* | 11/2014 | Chang | H01L 24/29 |
| | | | | 257/692 |
| 9,281,287 | B2* | 3/2016 | Chang | H01L 25/0657 |
| 9,496,239 | B1* | 11/2016 | Edelstein | H01L 21/187 |
| 9,502,370 | B2* | 11/2016 | Chang | H01L 24/32 |
| 11,177,250 | B2* | 11/2021 | Gardner | H01L 24/83 |
| 11,195,810 | B2 | 12/2021 | Chen et al. | |
| 11,315,903 | B2* | 4/2022 | Huang | H01L 25/0657 |
| 11,393,818 | B2* | 7/2022 | Dewey | H01L 29/7869 |
| 11,410,929 | B2* | 8/2022 | Chang | H01L 23/5286 |
| 11,502,072 | B2* | 11/2022 | Yu | H01L 24/33 |
| 2009/0004825 | A1* | 1/2009 | Senda | H01L 21/76256 |
| | | | | 438/459 |
| 2012/0043647 | A1* | 2/2012 | Gaudin | H01L 21/76251 |
| | | | | 257/618 |
| 2012/0138116 | A1* | 6/2012 | Bhusari | H01L 29/205 |
| | | | | 438/455 |
| 2013/0009321 | A1* | 1/2013 | Kagawa | H01L 23/53238 |
| | | | | 438/455 |
| 2014/0117510 | A1* | 5/2014 | Chang | H01L 24/29 |
| | | | | 438/455 |
| 2015/0054161 | A1* | 2/2015 | Chang | H01L 25/0657 |
| | | | | 257/765 |
| 2015/0179604 | A1* | 6/2015 | Wimplinger | C23C 14/081 |
| | | | | 156/150 |
| 2015/0287687 | A1* | 10/2015 | Farrens | H01L 21/2855 |
| | | | | 257/737 |
| 2017/0092620 | A1* | 3/2017 | Haba | H01L 21/2007 |
| 2017/0179077 | A1* | 6/2017 | Lin | H01L 25/50 |
| 2018/0006022 | A1* | 1/2018 | Edelstein | H01L 24/03 |
| 2018/0057939 | A1* | 3/2018 | Yun | H01B 13/0026 |
| 2019/0275561 | A1* | 9/2019 | Fife | B06B 1/0207 |
| 2020/0075444 | A1* | 3/2020 | Luo | H01L 25/0652 |
| 2020/0075539 | A1* | 3/2020 | Luo | H01L 23/31 |
| 2020/0243455 | A1* | 7/2020 | Wang | H10B 43/50 |
| 2021/0265319 | A1* | 8/2021 | Liu | H01L 25/50 |
| 2022/0328441 | A1* | 10/2022 | Chen | H01L 23/528 |
| 2022/0384314 | A1* | 12/2022 | Chen | H01L 24/27 |
| 2022/0392884 | A1* | 12/2022 | Yu | H01L 25/18 |

FOREIGN PATENT DOCUMENTS

| | | | | |
|---|---|---|---|---|
| CN | 105428437 A | * | 3/2016 | |
| CN | 109891582 A | * | 6/2019 | ....... H01L 21/76841 |
| CN | 109923668 A | * | 6/2019 | ....... H01L 21/76895 |
| JP | 2013073988 A | * | 4/2013 | ........... H01L 21/185 |
| TW | 201732888 A | | 9/2017 | |
| TW | 202109804 A | | 3/2021 | |
| WO | WO-2012074596 A1 | * | 6/2012 | ........... H01L 21/187 |

* cited by examiner

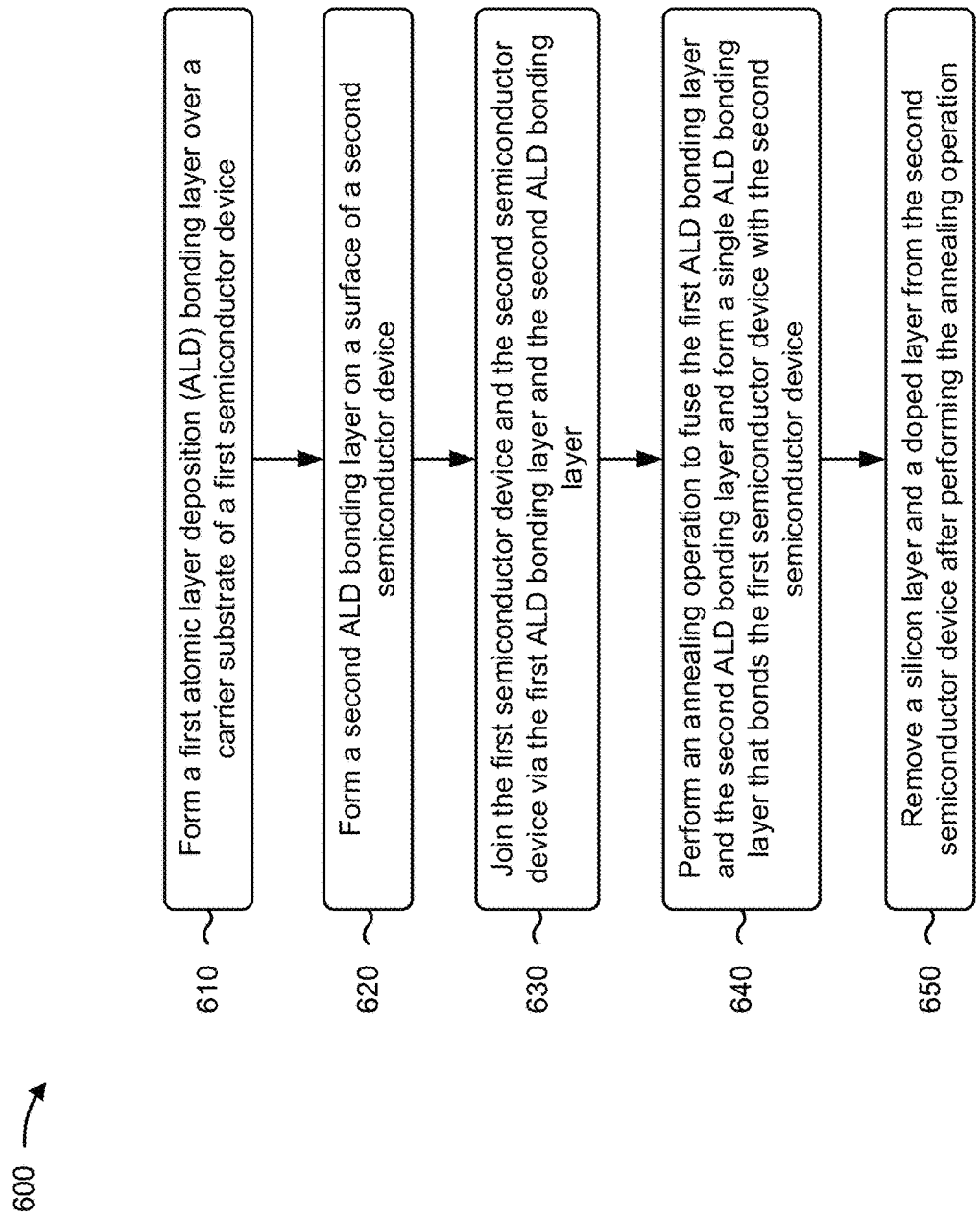

ATOMIC LAYER DEPOSITION BONDING LAYER FOR JOINING TWO SEMICONDUCTOR DEVICES

BACKGROUND

Bonding in the semiconductor industry is a technique that may be used to form stacked semiconductor devices and three-dimensional integrated circuits. Some examples of bonding include wafer to wafer bonding, die to wafer bonding, and die to die bonding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flowchart of an example process for utilizing an ALD bonding layer to join two semiconductor devices.

DETAILED DESCRIPTION

Figure 1:
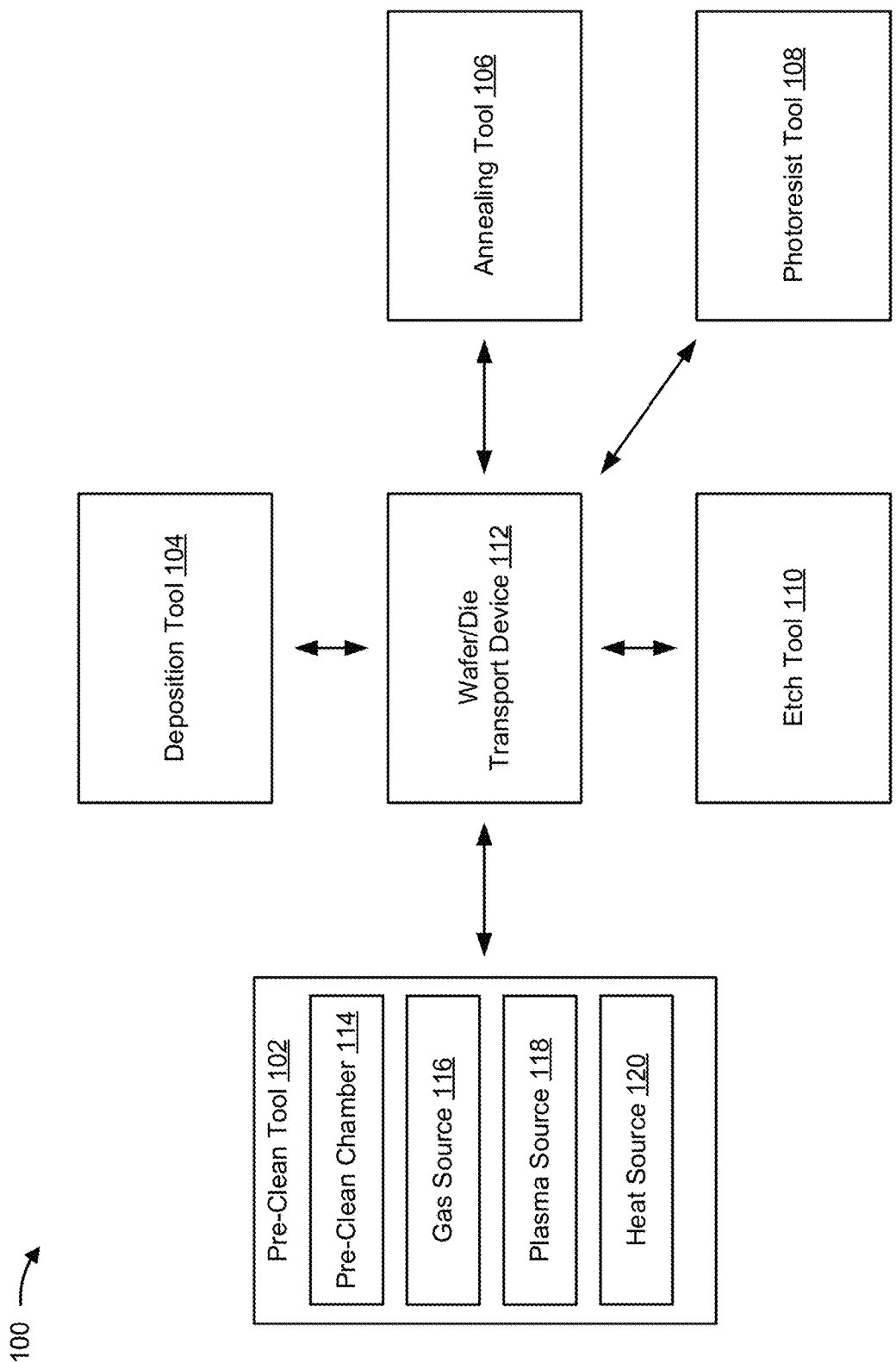
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various bonding techniques may be used to bond a first semiconductor device with a second semiconductor device, such as direct bonding, chemically activated bonding, plasma activated bonding, anodic bonding, eutectic bonding, glass fit bonding, adhesive bonding, thermo-compressive bonding, reactive bonding, and/or the like. As an example, in some bonding techniques, a thick bonding film may be deposited on a first semiconductor device or on a second semiconductor device. The thick bonding film may be a dielectric film of an oxide or another dielectric material, and may be deposited using a thick film deposition technique. The thick bonding film may be planarized using a planarization technique (e.g., a chemical mechanical polishing (CMP) technique) to flatten a top surface of the thick bonding film. A plasma (e.g., a nitrogen-based plasma or another type of plasma) may be used to pretreat the thick bonding film to promote adhesion between the first semiconductor device and the second semiconductor device. Such bonding techniques may include several costly and time-consuming processing techniques.

According to some implementations described herein, a method may include utilizing an ALD bonding layer to join two semiconductor devices. For example, the method may include forming a first ALD bonding layer on a surface of a first semiconductor device, and/or forming a second ALD bonding layer on a surface of a second semiconductor device. The method may include joining the first semiconductor device and the second semiconductor device via the first ALD bonding layer and/or the second ALD bonding layer, and performing an annealing operation to fuse the first ALD bonding layer and the second ALD bonding layer and form a single ALD bonding layer that bonds the first semiconductor device with the second semiconductor device.

In this way, a method may include utilizing an atomic layer deposition bonding layer to join two semiconductor devices. One or more ALD bonding layers may be formed (e.g., on a first semiconductor device and/or a second semiconductor device) as thin bonding layers (e.g., in a range from approximately ten Angstroms to approximately two hundred Angstroms) while maintaining control over surface uniformity and roughness of surfaces of the ALD bonding layers, which decreases a material cost of the ALD bonding layers. Moreover, the two semiconductor devices may be bonded using the ALD bonding layers and without having to planarize and pretreat the ALD bonding layers prior to bonding, which decreases a cost and a complexity of the bonding process and prevents formation of planarization slurry residue on the ALD bonding layers.

FIG. 1 is a diagram of an example environment 100 in which systems and/or methods described herein may be implemented. As shown in FIG. 1, environment 100 may include a pre-clean tool 102, a deposition tool 104, an annealing tool 106, a photoresist tool 108, an etch tool 110, and a wafer/die transport device 112. The tools and/or devices included in example environment 100 may be included in a semiconductor clean room, a semiconductor foundry, a semiconductor processing and/or manufacturing facility, and/or the like.

Pre-clean tool 102 includes a pre-clean chamber 114 and one or more devices capable of performing a pre-clean process on a semiconductor device to remove a byproduct layer from the semiconductor device. The one or more devices may include a gas source 116, a plasma source 118, a heat source 120, and/or the like. Gas source 116 may supply various gasses to pre-clean chamber 114, such as an ammonia gas, a nitrogen trifluoride gas, and/or the like. Plasma source 118 may generate a plasma that causes a reaction between the gasses supplied to pre-clean chamber 114. For example, plasma source 118 may include an inductively coupled plasma (ICP) source, transformer coupled plasma (TCP) source, or another type of plasma source capable of causing a reaction between an ammonia gas and a nitrogen trifluoride gas to cause the formation of an ammonium fluoride gas. Heat source 120 may be capable of heating a semiconductor device in pre-clean chamber 114 to cause one or more layers on the semiconductor device to decompose, as described herein. For example, heat source 120 may include a heat lamp, a heating coil, or another type of heating device that heats the semiconductor device to cause an ammonium fluoride layer on the semiconductor device to decompose into an ammonia gas and a hydrogen fluoride gas, as described herein.

Deposition tool 104 is a semiconductor processing tool that includes a semiconductor processing chamber and one or more devices capable of depositing various types of materials onto a semiconductor device. For example, deposition tool 104 may include a chemical vapor deposition device (e.g., an electrostatic spray device, an epitaxy device, and/or another type of chemical vapor deposition device), a physical vapor deposition device (e.g., a sputtering device and/or another type of physical vapor deposition device), an ion implantation device, and/or the like. In some implementations, deposition tool 104 may deposit a metal layer onto a source region or a drain region of a semiconductor device, may deposit a contact material to form a contact of a semiconductor device, and/or the like as described herein.

Annealing tool 106 is a semiconductor processing tool that includes a semiconductor processing chamber and one or more devices capable of heating a semiconductor device. For example, annealing tool 106 may include a rapid thermal annealing (RTA) tool or another type of annealing tool that is capable of heating a semiconductor device to cause a reaction between two or more materials or gasses, to cause a material to decompose, and/or the like. For example, annealing tool 106 may heat a semiconductor device to cause a metal layer on an epitaxial region (e.g., a source region or a drain region) to react and form a metal silicide layer, as described herein.

Photoresist tool 108 is a semiconductor processing tool that removes materials from or provides materials to a semiconductor device based on a photoresist layer (e.g., a photoresist mask) applied to the semiconductor device. A photoresist is a light-sensitive material used in several processes (e.g., photolithography, photoengraving, and/or the like) to form a patterned coating on a surface of a semiconductor device. Photoresist tool 108 may coat the semiconductor device with a photo-sensitive organic material, and may apply a patterned mask to the semiconductor device to block light, so that only unmasked regions of the photo-sensitive organic material will be exposed to light. Photoresist tool 108 or another tool (e.g., etch tool 110) may apply a solvent, called a developer, to the semiconductor device. In the case of a positive photoresist, the photo-sensitive organic material is degraded by light and the developer dissolves away regions that are exposed to light, leaving behind a coating where the mask is placed. In the case of a negative photoresist, the photo-sensitive organic material is strengthened (e.g., either polymerized or cross-linked) by light, and the developer dissolves away only regions that are not exposed to light, leaving behind a coating in areas where the mask is not placed.

Etch tool 110 is a semiconductor processing tool that removes materials from a surface of a semiconductor device. In some implementations, a portion of the semiconductor device is protected from an etchant by a masking material that resists etching. For example, the masking material may include a photoresist that is patterned using photolithography. Etch tool 110 may perform a wet etching process or a dry (e.g., plasma) etching process on the semiconductor device. In the wet etching process, the semiconductor device may be immersed in a batch of a liquid-phase (e.g., wet) etchant, which may be agitated to achieve process control. For example, a buffered hydrofluoric acid (BHF) may be used to etch silicon dioxide over a silicon substrate. The plasma etching process may operate in several modes based on adjusting parameters of the plasma. For example, the plasma etching process may operate at a pressure in a range from approximately 0.01 Torr to approximately 5 Torr. The plasma produces energetic free radicals, that are neutrally charged and that react at a surface of the semiconductor device. Plasma etching may be isotropic (e.g., exhibiting a lateral undercut rate on a patterned surface approximately the same as a downward etch rate) or anisotropic (e.g., exhibiting a smaller lateral undercut rate than the downward etch rate). A source gas for the plasma may include small molecules rich in chlorine or fluorine. For example, carbon tetra fluorine may be utilized to etch silicon and chlorine may be utilized to etch aluminum, trifluoro methane may be used to etch silicon dioxide and silicon nitride, and/or the like. The plasma may also include oxygen that is used to oxidize photoresist and facilitate removal of the photoresist.

Wafer/die transport device 112 includes a mobile robot, a robot arm, a tram or rail car, and/or another type of device that are used to transport wafers and/or dies between semiconductor processing tools 102-110 and/or to and from other locations, such as a wafer rack, a storage room, and/or the like. In some implementations, wafer/die transport device 112 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set devices of environment 100.

Figure 2A:
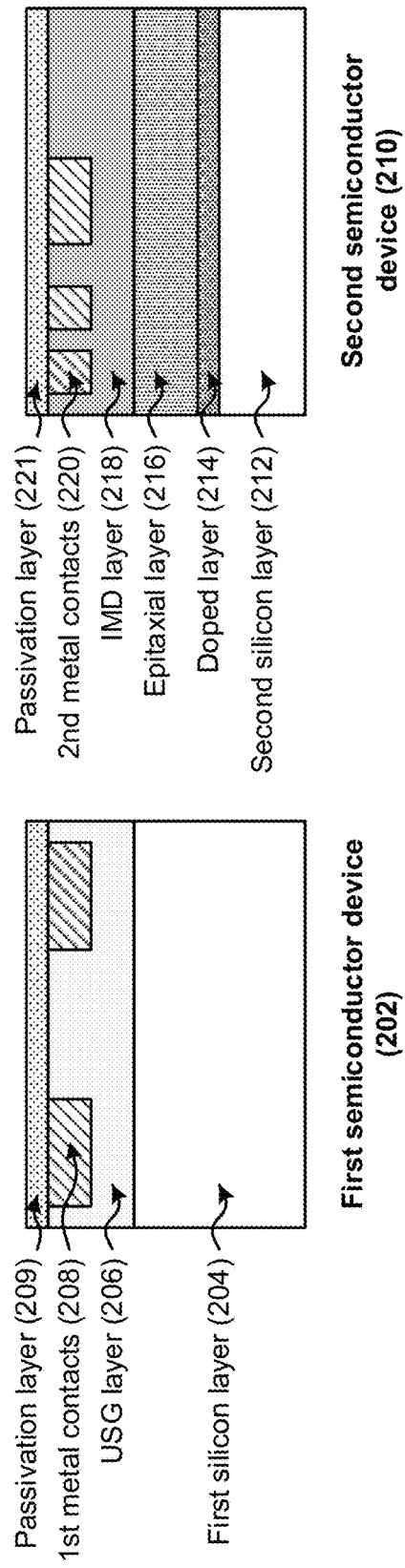
FIGS. 2A-2H are diagrams of one or more example operations involved in manufacturing an example semiconductor device described herein.

FIGS. 2A-2H are diagrams of one or more example operations 200 involved in manufacturing an example semiconductor device described herein (e.g., a logic device, a memory device, a finFET, a MOSFET, and/or the like). As shown in FIG. 2A, a first semiconductor device 202 may include a first silicon layer 204, an undoped silicate glass (USG) layer 206 provided on first silicon layer 204, first metal contacts 208 formed in USG layer 206, and a passivation layer 209 formed on USG layer 206 and first metal contacts 208. First semiconductor device 202 may include a semiconductor wafer, a semiconductor die, and/or the like.

First silicon layer 204 may include a silicon wafer sliced from a silicon crystal ingot grown as a cylinder. First silicon layer 204 may include an electrical conductivity value falling between that of a conductor, such as metallic copper, and an insulator, such as glass. First silicon layer 204 may be replaced with other materials, such as germanium, gallium arsenide, silicon germanium, and/or the like.

USG layer 206 may include an undoped silicate glass that protects and isolates elements of first semiconductor device 202. USG layer 206 may include a high deposition rate at low temperatures, and may include similar properties to silicon dioxide. USG layer 206 may be utilized as an insulator and passivation layer in multilevel interlevel dielectric devices (e.g., to electrically insulate first metal contacts 208 from other components of first semiconductor device 202). In some implementations, deposition tool 104 of environment 100, described above in connection with FIG. 1, may be utilized to form USG layer 206 on a top surface of first silicon layer 204. For example, deposition tool 104 may perform a plasma-enhanced chemical vapor deposition (PECVD) process, a high density plasma CVD (HDPCVD) process, a sub-atmospheric CVD (SACVD) process, and/or the like to deposit USG layer 206 on the top surface of first silicon layer 204.

First metal contacts 208 may include a conductive metal, such as titanium, cobalt, tungsten, aluminum, copper, ruthenium, iridium, and/or the like. In some implementations, first metal contacts 208 may be formed within openings formed in USG layer 206. In some implementations, deposition tool 104 of environment 100, described above in connection with FIG. 1, may be utilized to perform a deposition operation that forms first metal contacts 208 in the openings of USG layer 206. In some implementations, etch tool 110 of environment 100, described above in connection with FIG. 1, may be utilized to form the openings in USG layer 206, prior to formation of first metal contacts 208 in the openings.

Passivation layer 209 may include an oxide material (e.g., a metal oxide) that is inert and does not change semiconductor properties as a result of interaction with air or other materials in contact with passivation layer 209. Passivation layer 209 may allow electricity to reliably penetrate to conducting layers provided below passivation layer 209, and to overcome surface states that prevent electricity from reaching the conducting layers. In some implementations, deposition tool 104 of environment 100, described above in connection with FIG. 1, may be utilized to form passivation layer 209 on the top surface of USG layer 206 and first metal contacts 208.

As further shown in FIG. 2A, a second semiconductor device 210 may include a second silicon layer 212, a doped layer 214 provided on second silicon layer 212, an epitaxial layer 216 formed on doped layer 214, an intermetal dielectric (IMD) layer 218 formed on epitaxial layer 216, second metal contacts 220 formed in IMD layer 218, and a passivation layer 221 formed on IMD layer 218 and second metal contacts 220. Second semiconductor device 210 may include a semiconductor wafer, a semiconductor die, and/or the like. In some implementations, a ratio between a thickness of first semiconductor device 202 and second semiconductor device 210 may be in a range of approximately 5 percent and approximately 30 percent.

Second silicon layer 212 may include a silicon wafer sliced from a silicon crystal ingot grown as a cylinder. Second silicon layer 212 may include an electrical conductivity value falling between that of a conductor, such as metallic copper, and an insulator, such as glass. Second silicon layer 212 may be replaced with other materials, such as germanium, gallium arsenide, silicon germanium, and/or the like.

Doped layer 214 may include a material (e.g., silicon, germanium, silicon carbide, silicon germanium, and/or the like) that is doped with a dopant material (e.g., boron, arsenic, phosphorus, gallium, and/or the like). Doping is the intentional introduction of impurities into an intrinsic semiconductor material for the purpose of modulating electrical, optical, and/or structural properties of the semiconductor material. In some implementations, deposition tool 104 of environment 100, described above in connection with FIG. 1, may be utilized to perform a deposition operation that forms the intrinsic semiconductor material on a top surface of second silicon layer 212. Deposition tool 104 (e.g., an ion implantation tool) may also be utilized to implant the dopant material in the intrinsic semiconductor material and form doped layer 214.

Epitaxial layer 216 may include a silicon germanium formed via epitaxial growth. In some implementations, epitaxial layer 216 includes other materials, such as silicon, silicon carbide, silicon germanium, gallium arsenide, gallium phosphide, and/or the like. In some implementations, deposition tool 104 of environment 100, described above in connection with FIG. 1, may be utilized to perform a deposition operation that forms epitaxial layer 216 on a top surface of doped layer 214.

IMD layer 218 may include an intermetal dielectric material, such as silicon dioxide, a low dielectric constant (e.g., k values in a range of 3.2 to 2.0) dielectric material, fluorinated silica glass, silicon, silicon nitride, silicon oxide, and/or the like, that electrically insulates second metal contacts 220 from other components of second semiconductor device 210. In some implementations, deposition tool 104 of environment 100, described above in connection with FIG. 1, may be utilized to form IMD layer 218 on a top surface of epitaxial layer 216. For example, deposition tool 104 may perform a PECVD process, an HDPCVD process, an SACVD process, and/or the like to deposit IMD layer 218 on the top surface of epitaxial layer 216.

Second metal contacts 220 may include a conductive metal, such as titanium, cobalt, tungsten, aluminum, copper, ruthenium, iridium, and/or the like. In some implementations, second metal contacts 220 may be formed within openings formed in IMD layer 218. In some implementations, deposition tool 104 of environment 100, described above in connection with FIG. 1, may be utilized to perform a deposition operation that forms second metal contacts 220 in the openings of IMD layer 218. In some implementations, etch tool 110 of environment 100, described above in connection with FIG. 1, may be utilized to form the openings in IMD layer 218, prior to formation of second metal contacts 220 in the openings.

Passivation layer 221 may include an oxide material (e.g., a metal oxide) that is inert and does not change semiconductor properties as a result of interaction with air or other materials in contact with passivation layer 221. Passivation layer 221 may allow electricity to reliably penetrate to conducting layers provided below passivation layer 221, and to overcome surface states that prevent electricity from reaching the conducting layers. In some implementations, deposition tool 104 of environment 100, described above in connection with FIG. 1, may be utilized to form passivation layer 221 on the top surface of IMD layer 218 and second metal contacts 220.

Figure 2B:
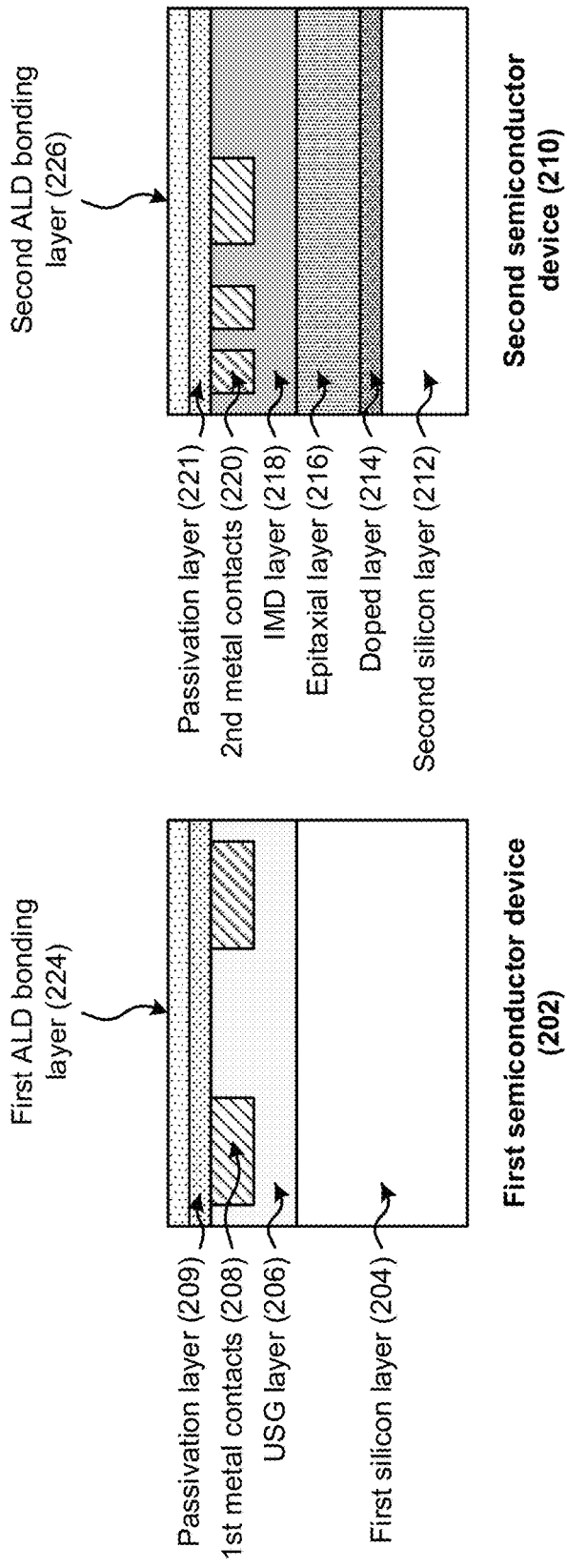

As shown in FIG. 2B, and by reference number 222, an atomic layer deposition (ALD) operation may be performed to form a first ALD bonding layer 224 on a top surface of first semiconductor device 202 and a second ALD bonding layer 226 on a top surface of second semiconductor device 210. For example, first ALD bonding layer 224 may be formed on top surfaces of USG layer 206 and first metal contacts 208, and second ALD bonding layer 226 may be formed on top surfaces of IMD layer 218 and second metal contacts 220. In some implementations, first ALD bonding layer 224 and second ALD bonding layer 226 each includes a thickness that enables maintaining control over surface uniformity and roughness of surfaces of first ALD bonding layer 224 and second ALD bonding layer 226, which decreases a material cost of first ALD bonding layer 224 and second ALD bonding layer 226. For example, first ALD bonding layer 224 and second ALD bonding layer 226 each may include a thickness in a range from approximately 10 Angstroms to approximately 200 Angstroms, which is much thinner than thicknesses of current bonding layers. As another example, the first ALD bonding layer 224 and/or the second ALD bonding layer 226 may each include a thickness in a range from approximately 20 Angstroms to approximately 50 angstroms. Each of first ALD bonding layer 224 and second ALD bonding layer 226 may include a dielectric material, such as silicon, silicon nitride, silicon oxide, silicon dioxide, an organo-silicate glass, a spin-on organic polymeric dielectric, and/or the like.

In some implementations, deposition tool 104 of environment 100, described above in connection with FIG. 1, may be utilized to form first ALD bonding layer 224 on the top surface of first semiconductor device 202 and second ALD bonding layer 226 on the top surface of second semiconductor device 210. For example, deposition tool 104 may perform the atomic layer deposition operation to form first ALD bonding layer 224 on the top surface of first semiconductor device 202 and second ALD bonding layer 226 on the top surface of second semiconductor device 210. In some implementations, the atomic layer deposition operation may be performed under particular process conditions to form first ALD bonding layer 224 on the top surface of first semiconductor device 202 and second ALD bonding layer 226 on the top surface of second semiconductor device 210. For example, the atomic layer deposition operation may include a deposition operation the deposits each of first ALD bonding layer 224 and second ALD bonding layer 226 with a thickness that enables maintaining control over surface uniformity and roughness of surfaces of first ALD bonding layer 224 and second ALD bonding layer 226. In this way, the atomic layer deposition operation may decrease a material cost of first ALD bonding layer 224 and second ALD bonding layer 226.

After forming the first ALD bonding layer 224 and the second ALD bonding layer 226, no CMP operation and no plasma treatment operation is performed on the first ALD bonding layer 224 and the second ALD bonding layer 226. CMP and plasma treatment may increase the surface roughness of the first ALD bonding layer 224 and the second ALD bonding layer 226, which would decrease direct bonding performance between the first ALD bonding layer 224 and the second ALD bonding layer 226. For example, an average root means square surface roughness (Rq) of the first ALD bonding layer 224 and the second ALD bonding layer 226 after CMP may be approximately 1 Angstrom, whereas the Rq of the first ALD bonding layer 224 and the second ALD bonding layer 226 after ALD deposition without CMP and without plasma treatment may be less than 1 Angstrom. In particular, the Rq of the first ALD bonding layer 224 and the second ALD bonding layer 226 after ALD deposition without CMP and without plasma treatment may be in a range of approximately equal to or greater than 0.75 Angstroms for a layer thickness of approximately 25 Angstroms and less than 1 Angstrom for a layer thickness of approximately 100 Angstroms.

Figure 2C:
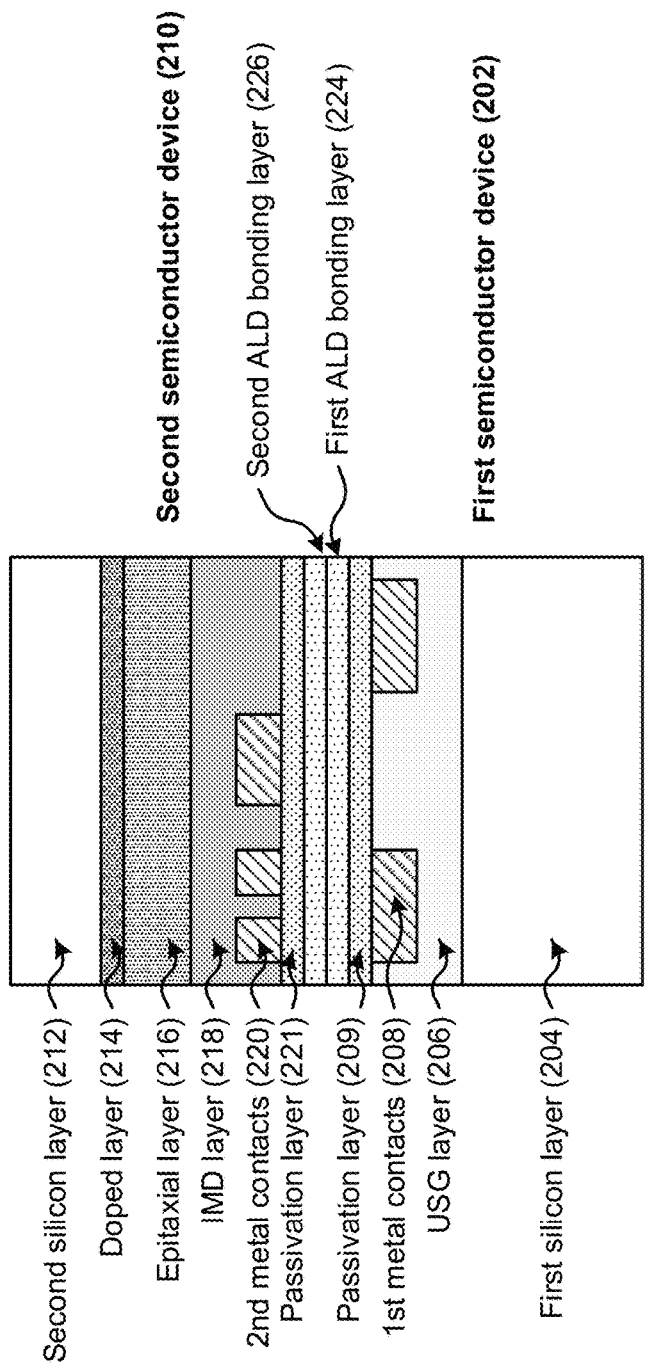

As shown in FIG. 2C, and by reference number 228, first semiconductor device 202 and second semiconductor device 210 may be joined via first ALD bonding layer 224 and second ALD bonding layer 226. For example, one of first semiconductor device 202 or second semiconductor device 210 may be rotated one-hundred and eighty degrees so that first ALD bonding layer 224 faces second ALD bonding layer 226. FIG. 2C shows second semiconductor device 210 being rotated one-hundred and eighty degrees, but first semiconductor device 202 may be rotated one-hundred and eighty degrees instead of second semiconductor device 210. Once first ALD bonding layer 224 faces second ALD bonding layer 226, first ALD bonding layer 224 may be joined together with second ALD bonding layer 226, which may join first semiconductor device 202 and second semiconductor device 210. Thus, as shown in the example orientation of FIG. 2C, second ALD bonding layer 226 may be provided on a top surface of first ALD bonding layer 224. Second metal contacts 220 and IMD layer 218 may be provided on second ALD bonding layer 226, and epitaxial layer 216 may be provided on IMD layer 218. Doped layer 214 may be provided on epitaxial layer 216, and second silicon layer 212 may be provided on doped layer 214. The first ALD bonding layer 224 and the second ALD bonding layer 226 may be joined without a CMP operation and without plasma treatment operation on the first ALD bonding layer 224 and the second ALD bonding layer 226 after formation of the first ALD bonding layer 224 and the second ALD bonding layer 226.

In some implementations, each of first ALD bonding layer 224 and second ALD bonding layer 226 includes a ratio of silicon hydroxide and silicon monoxide in a range from approximately five percent to approximately twenty percent to enable direct bonding of first semiconductor device 202 and second semiconductor device 210. A bonding strength of each of first ALD bonding layer 224 and second ALD bonding layer 226 may be greater than two Joules per square meter to enable direct bonding of first semiconductor device 202 and second semiconductor device 210. For example, the bonding strength of each of first ALD bonding layer 224 and second ALD bonding layer 226 may be approximately greater than 2.5 Joules per square meter. In some implementations, first semiconductor device 202 and second semiconductor device 210 are joined via first ALD bonding layer 224 and second ALD bonding layer 226 without pretreating first ALD bonding layer 224 and second ALD bonding layer 226. The bonding strength of first ALD bonding layer 224 and second ALD bonding layer 226 eliminates a need for expensive and time consuming plasma pretreatment utilized in current bonding processes.

In some implementations, a uniformity of each of first ALD bonding layer 224 and second ALD bonding layer 226 is in a range from approximately one percent to approximately two percent to enable direct bonding of first semiconductor device 202 and second semiconductor device 210. In some implementations, a nitrogen concentration between a surface of first ALD bonding layer 224 and a surface of second ALD bonding layer 226 is less than two percent (e.g., at the bonding interface between the first ALD layer 224 and the second ALD layer 226) to enable direct bonding of first semiconductor device 202 and second semiconductor device 210. The uniformity and the nitrogen concentration associated with first ALD bonding layer 224 and second ALD bonding layer 226 eliminates a need for expensive and time consuming chemical mechanical polishing planarization utilized in current bonding processes.

In some implementations, first ALD bonding layer 224 or second ALD bonding layer 226 may be omitted and a single ALD bonding layer may be provided on the top surface of first semiconductor device 202 or on the top surface of second semiconductor device 210. In such implementations, first semiconductor device 202 and second semiconductor device 210 may be joined together by the single ALD bonding layer. The single ALD bonding layer may include the properties described above in connection with first ALD bonding layer 224 and/or second ALD bonding layer 226.

Figure 2D:
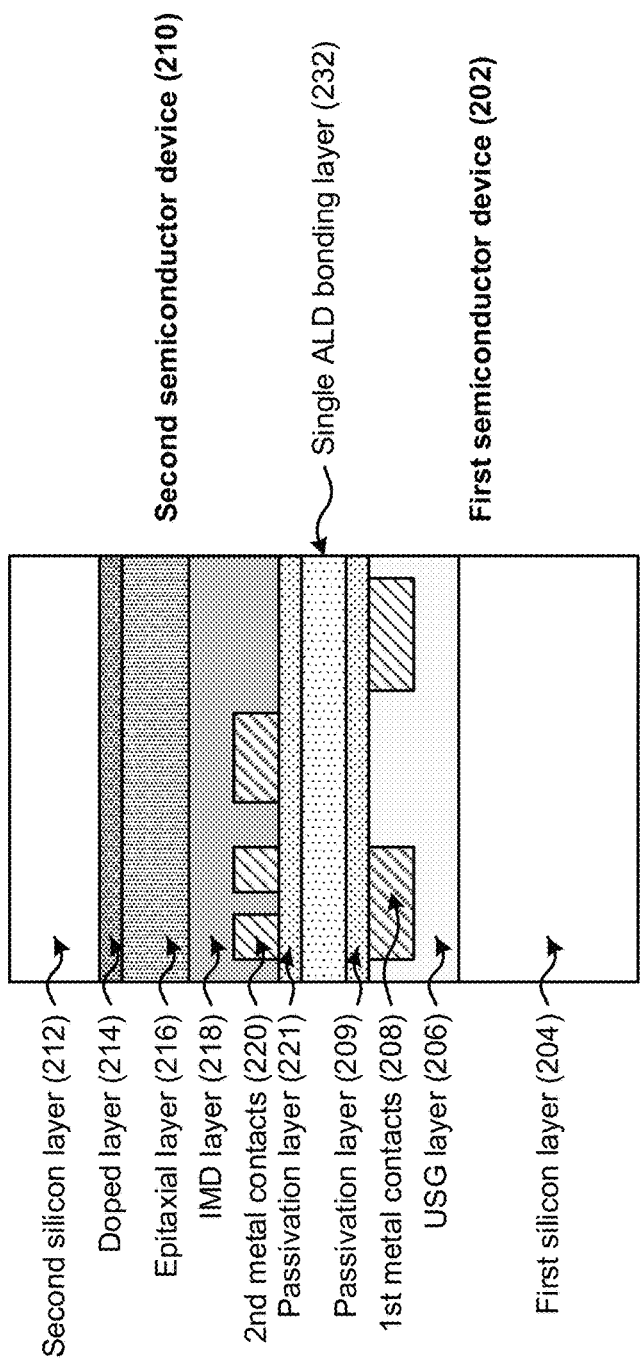

As shown in FIG. 2D, and by reference number 230, an annealing operation may be performed to fuse first ALD bonding layer 224 and second ALD bonding layer 226 and form a single ALD bonding layer 232. Single ALD bonding layer 232 may include the properties described above in connection with first ALD bonding layer 224 and/or second ALD bonding layer 226 since single ALD bonding layer 232 is formed from fusing together first ALD bonding layer 224 and second ALD bonding layer 226. In some implementations, single ALD bonding layer 232 includes a ratio of silicon hydroxide and silicon monoxide in a range from approximately five percent to approximately twenty percent to enable direct bonding of first ALD bonding layer 224 and second ALD bonding layer 226 to form single ALD bonding layer 232.

In some implementations, annealing tool 106 of environment 100, described above in connection with FIG. 1, may be utilized to perform the annealing operation to fuse first ALD bonding layer 224 and second ALD bonding layer 226 (e.g., through covalent bonding of first ALD bonding layer 224 and second ALD bonding layer 226) and form single ALD bonding layer 232. In some implementations, the annealing operation may be performed under particular process conditions to fuse first ALD bonding layer 224 and second ALD bonding layer 226 and form single ALD bonding layer 232. For example, the annealing operation may be performed at a temperature in a range from approximately one-hundred and fifty degrees Celsius to approximately four hundred degrees Celsius and for a time period in a range from approximately thirty minutes to approximately three hours, to fuse first ALD bonding layer 224 and second ALD bonding layer 226 and form single ALD bonding layer 232.

Figure 2E:
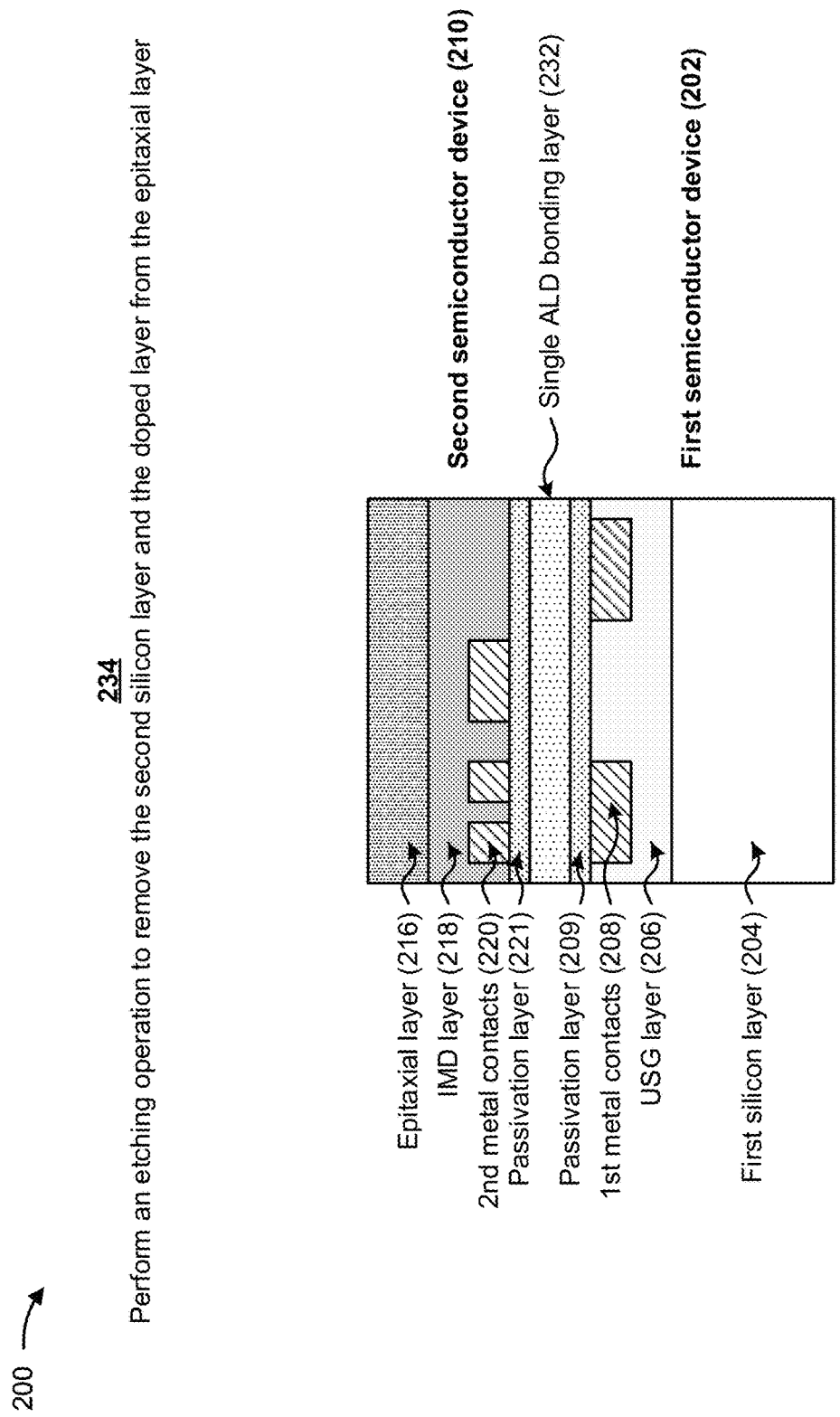

As shown in FIG. 2E, and by reference number 234, an etching operation may be performed to remove second silicon layer 212 and doped layer 214 from epitaxial layer 216. In some implementations, a first etching operation is performed to remove second silicon layer 212 from doped layer 214, and a second etching operation is performed to remove doped layer 214 from epitaxial layer 216. In some implementations, etch tool 110 of environment 100, described above in connection with FIG. 1, may be utilized to perform the first etching operation to remove second silicon layer 212 from doped layer 214, and to perform the second etching operation to remove doped layer 214 from epitaxial layer 216. In some implementations, a single etching operation is performed to remove second silicon layer 212 and doped layer 214 from epitaxial layer 216.

Figure 2F:
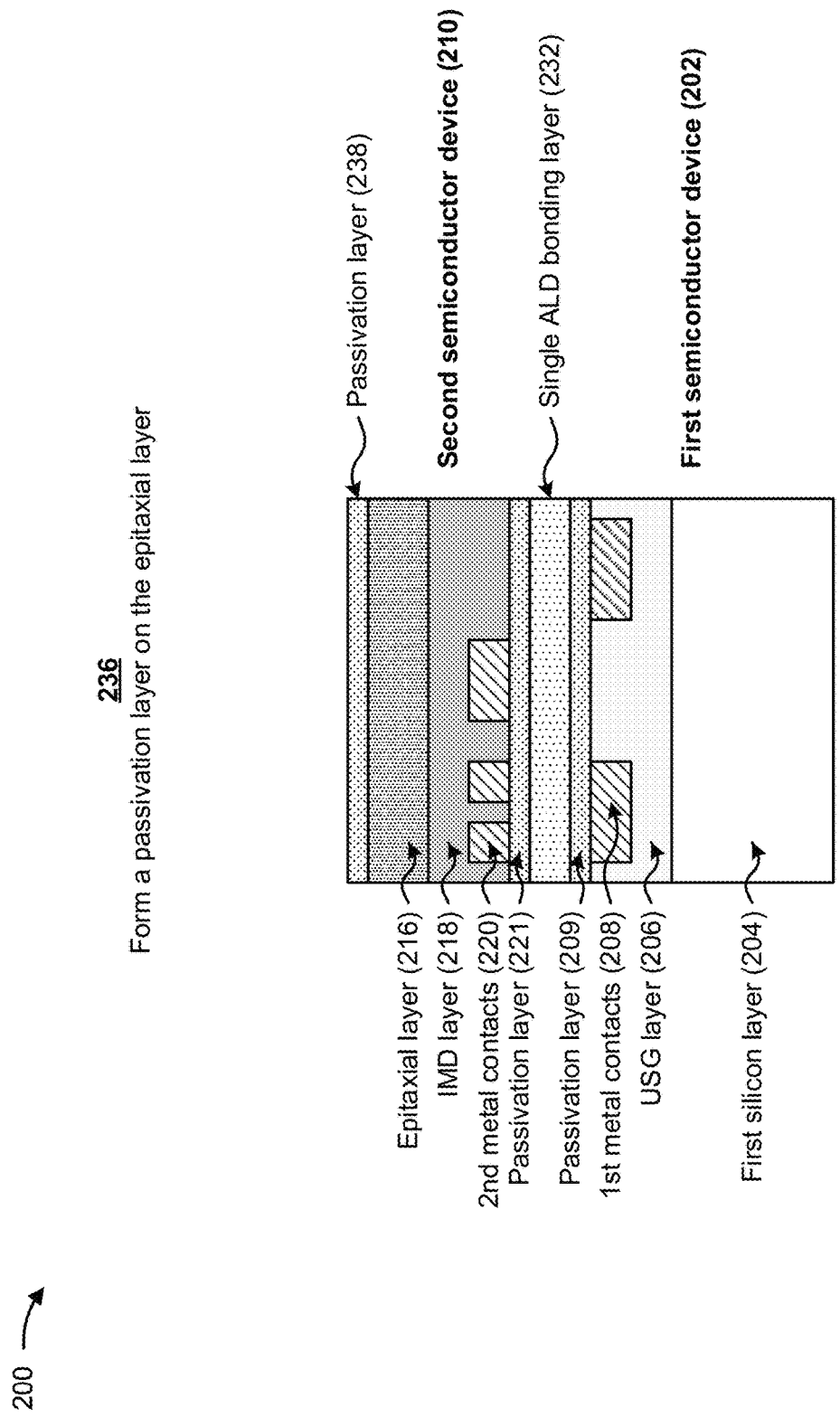

As shown in FIG. 2F, and by reference number 236, a passivation layer 238 may be formed on epitaxial layer 216. For example, passivation layer 238 may be deposited on a top surface of epitaxial layer 216. Passivation layer 238 may include an oxide material (e.g., a metal oxide) that is inert and does not change semiconductor properties as a result of interaction with air or other materials in contact with passivation layer 238. Passivation layer 238 may allow electricity to reliably penetrate to conducting layers provided below passivation layer 238, and to overcome surface states that prevent electricity from reaching the conducting layers. In some implementations, deposition tool 104 of environment 100, described above in connection with FIG. 1, may be utilized to form passivation layer 238 on the top surface of epitaxial layer 216.

Figure 2G:
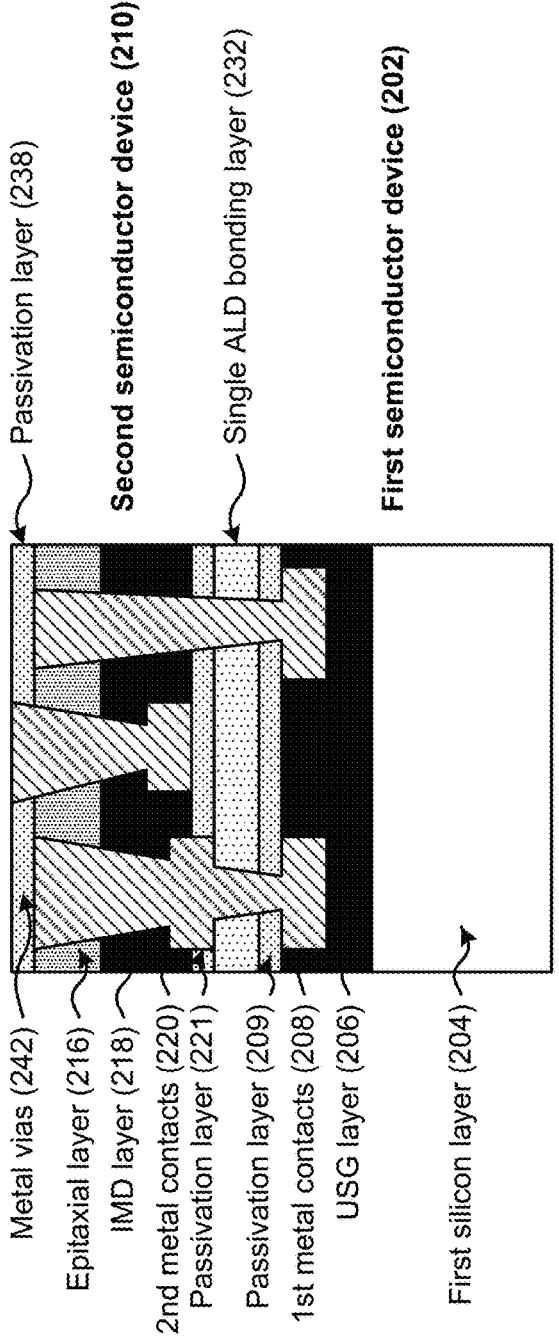

As shown in FIG. 2G, and by reference number 240, metal vias 242 may be formed, through passivation layer 238, epitaxial layer 216, IMD layer 218, and single ALD bonding layer 232, to connect with first metal contacts 208 and second metal contacts 220. For example, one or more etching operations may be performed to form openings through passivation layer 238, epitaxial layer 216, IMD layer 218, second metal contacts 220, and single ALD bonding layer 232. One or more deposition operations may then be performed to provide metal vias 242 in the openings formed through passivation layer 238, epitaxial layer 216, IMD layer 218, second metal contacts 220, and single ALD bonding layer 232. Metal vias 242 may include a conductive metal, such as titanium, cobalt, tungsten, aluminum, copper, ruthenium, iridium, and/or the like. In some implementations, deposition tool 104 and etch tool 110 of environment 100, described above in connection with FIG. 1, may be utilized to form metal vias 242, through passivation layer 238, epitaxial layer 216, IMD layer 218, and single ALD bonding layer 232, to connect with first metal contacts 208 and second metal contacts 220.

In some implementations, a metal via 242 may be formed for each of first metal contacts 208 and each of second metal contacts 220; a single metal via 242 may be formed that connects with two or more first metal contacts 208 and/or two or more second metal contacts 220; and/or the like.

Figure 2H:
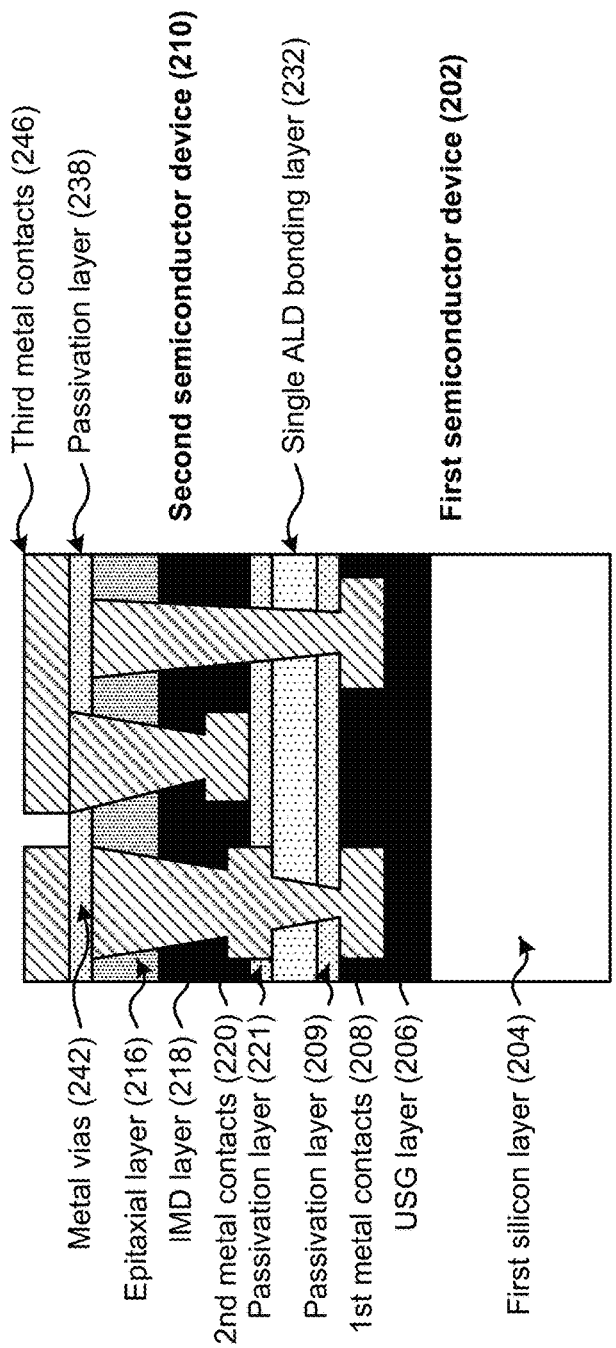

As shown in FIG. 2H, and by reference number 244, third metal contacts 246 may be formed on metal vias 242. Third metal contacts 246 may include a conductive metal, such as titanium, cobalt, tungsten, aluminum, copper, ruthenium, iridium, and/or the like. In some implementations, deposition tool 104 of environment 100, described above in connection with FIG. 1, may be utilized to form third metal contacts 246 on metal vias 242. The final arrangement may include stacked semiconductor devices (e.g., first semiconductor device 202 and second semiconductor device 210), a three-dimensional integrated circuit, and/or the like. In some implementations, a third metal contact 246 may be formed on each of metal vias 242; a single third metal contact 246 may be formed on two or more metal vias 242; and/or the like.

As indicated above, FIGS. 2A-2H are provided merely as one or more examples. Other examples may differ from what is described with regard to FIGS. 2A-2H.

Figure 3:
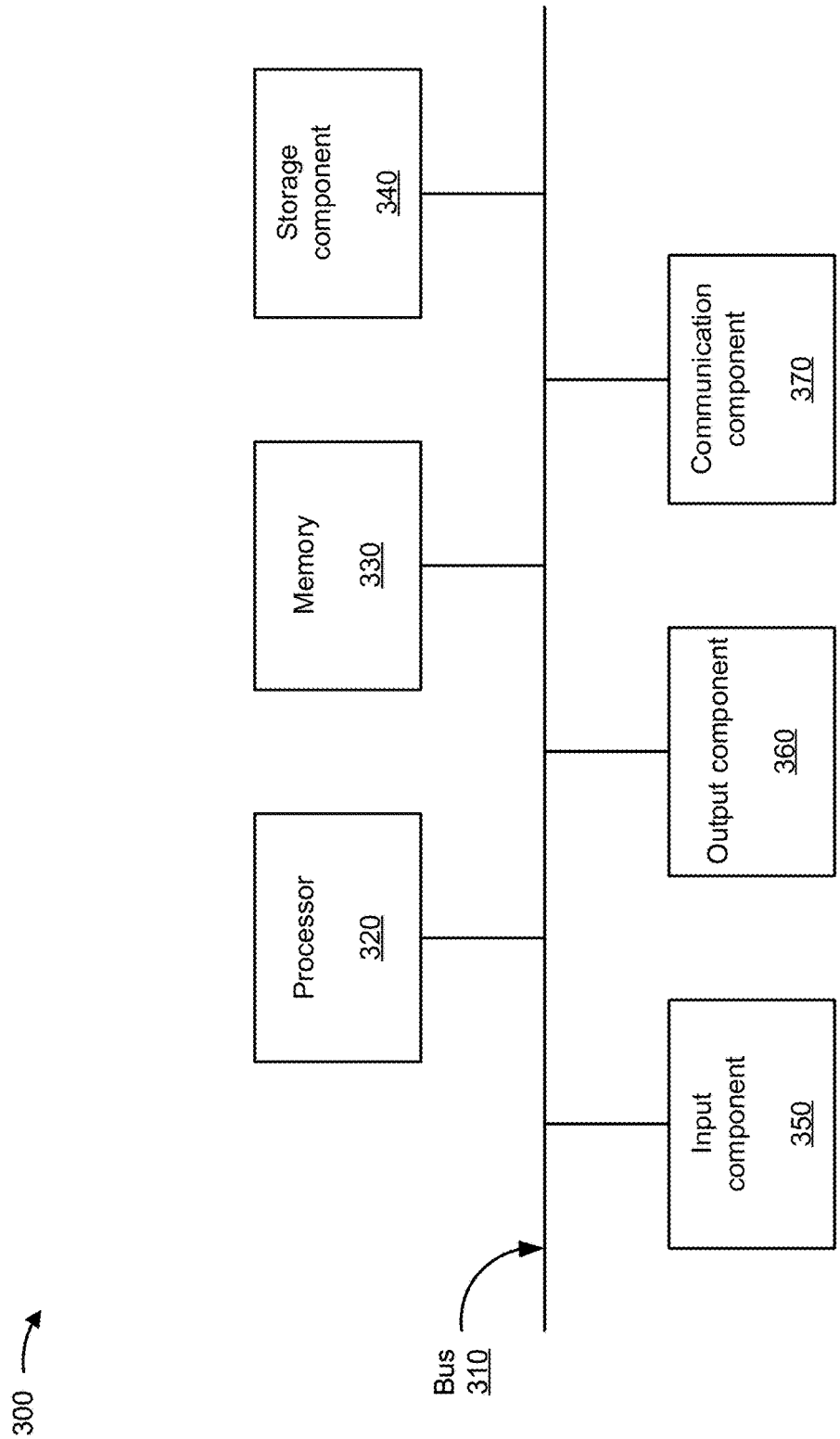
FIG. 3 is a diagram of example components of one or more tools and/or devices of FIG. 1.

FIG. 3 is a diagram of example components of a device 300. Device 300 may correspond to pre-clean tool 102, deposition tool 104, annealing tool 106, photoresist tool 108, etch tool 110, and/or wafer/die transport device 112. In some implementations, pre-clean tool 102, deposition tool 104, annealing tool 106, photoresist tool 108, etch tool 110, and/or wafer/die transport device 112 may include one or more devices 300 and/or one or more components of device 300. As shown in FIG. 3, device 300 may include a bus 310, a processor 320, a memory 330, a storage component 340, an input component 350, an output component 360, and a communication component 370.

Bus 310 includes a component that permits communication among the components of device 300. Processor 320 is implemented in hardware, firmware, or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more LEDs).

Communication component 370 includes a transceiver-like component (e.g., a transceiver and/or a separate receiver and transmitter) that enables device 300 to communicate with other devices, such as via a wired connection, a wireless connection, or a combination of wired and wireless connections. Communication component 370 may permit device 300 to receive information from another device and/or provide information to another device. For example, communication component 370 may include an Ethernet interface, an optical interface, a coaxial interface, an infrared interface, an RF interface, a universal serial bus (USB) interface, a wireless local area interface, a cellular network interface, and/or the like.

Device 300 may perform one or more processes described herein. Device 300 may perform these processes based on processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication component 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
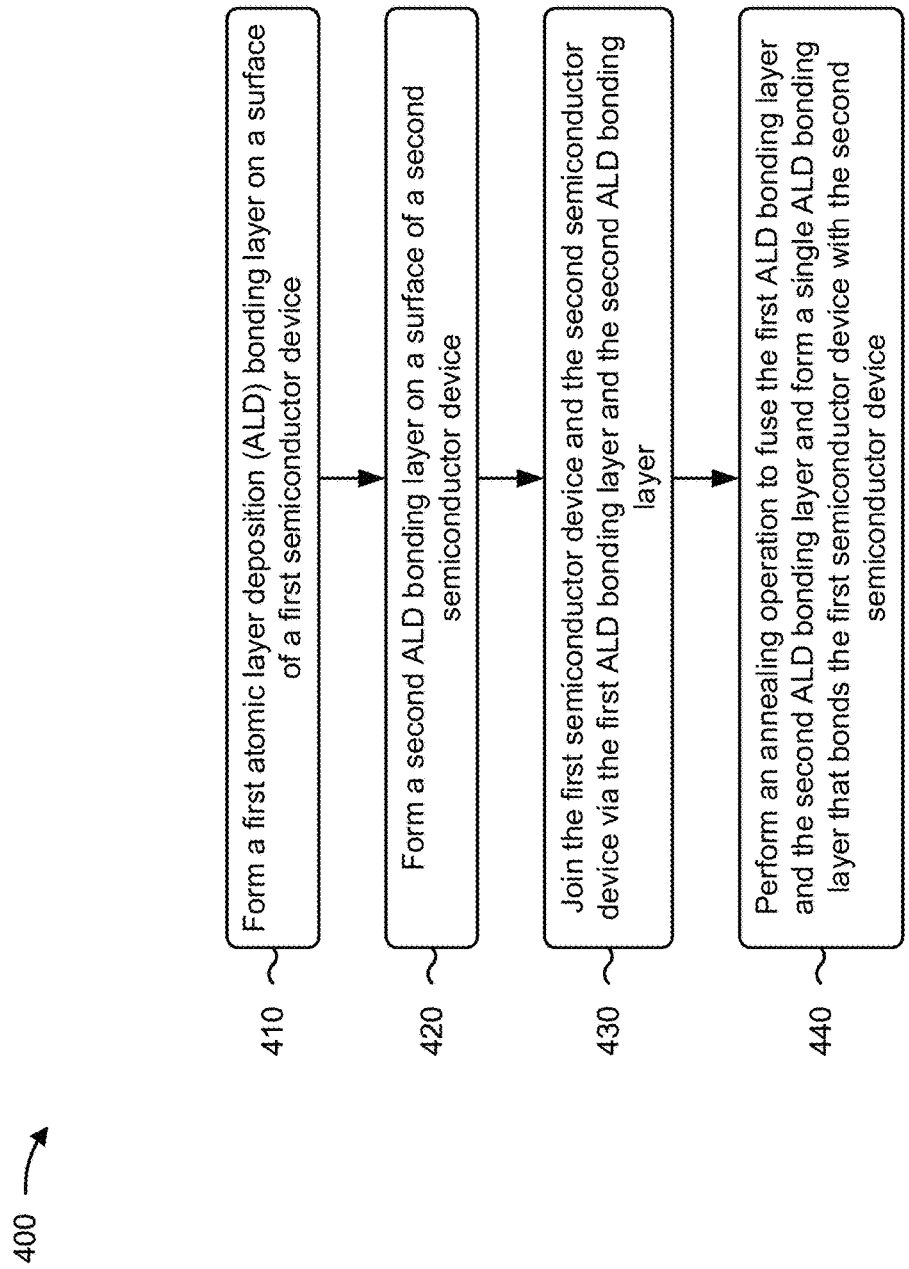
FIG. 4 is a flowchart of an example process for utilizing an atomic layer deposition (ALD) bonding layer to join two semiconductor devices.

FIG. 4 is a flow chart of an example process 400 for utilizing an ALD bonding layer to join two semiconductor devices. In some implementations, one or more process blocks of FIG. 4 may be performed by a device (e.g., one or more of the tools depicted in FIG. 1). In some implementations, one or more process blocks of FIG. 4 may be performed by another device or a group of devices separate from or including the one or more tools depicted in FIG. 1. Additionally, or alternatively, one or more process blocks of FIG. 4 may be performed by one or more components of device 300, such as processor 320, memory 330, storage component 340, input component 350, output component 360, communication component 370, and/or the like.

As shown in FIG. 4, process 400 may include forming a first atomic layer deposition (ALD) bonding layer on a surface of a first semiconductor device (block 410). For example, the device may form a first ALD bonding layer 224 on a surface of a first semiconductor device 202, as described above.

As further shown in FIG. 4, process 400 may include forming a second ALD bonding layer on a surface of a second semiconductor device (block 420). For example, the device may form a second ALD bonding layer 226 on a surface of a second semiconductor device 210, as described above.

As further shown in FIG. 4, process 400 may include joining the first semiconductor device and the second semiconductor device via the first ALD bonding layer and the second ALD bonding layer (block 430). For example, the device may join the first semiconductor device 202 and the second semiconductor device 210 via the first ALD bonding layer 224 and the second ALD bonding layer 226, as described above.

As further shown in FIG. 4, process 400 may include performing an annealing operation to fuse the first ALD bonding layer and the second ALD bonding layer and form a single ALD bonding layer that bonds the first semiconductor device with the second semiconductor device (block 440). For example, the device may perform an annealing operation to fuse the first ALD bonding layer 224 and the second ALD bonding layer 226 and form a single ALD bonding layer 232 that bonds the first semiconductor device 202 with the second semiconductor device 210, as described above.

Process 400 may include additional implementations, such as any single implementation or any combination of implementations described below and/or in connection with one or more other processes described elsewhere herein.

In a first implementation, each of the first ALD bonding layer 224 and the second ALD bonding layer 226 includes a thickness in a range from approximately ten Angstroms to approximately two hundred Angstroms. In a second implementation, alone or in combination with the first implementation, joining the first semiconductor device 202 and the second semiconductor device 202 via the first ALD bonding layer 224 and the second ALD bonding layer 226 includes joining the first semiconductor device 202 and the second semiconductor device 210 via the first ALD bonding layer 224 and the second ALD bonding layer 226 without planarizing the first ALD bonding layer 224 or the second ALD bonding layer 226.

In a third implementation, alone or in combination with one or more of the first and second implementations, a bonding strength of each of the first ALD bonding layer 224 and the second ALD bonding layer 226 is greater than two Joules per square meter to enable direct bonding of the first semiconductor device 202 and the second semiconductor device 210. In a fourth implementation, alone or in combination with one or more of the first through third implementations, joining the first semiconductor device 202 and the second semiconductor device 210 via the first ALD bonding layer 224 and the second ALD bonding layer 226 includes joining the first semiconductor device 202 and the second semiconductor device 201 via the first ALD bonding layer 224 and the second ALD bonding layer 226 without pretreating the first ALD bonding layer 224 and the second ALD bonding layer 226.

In a fifth implementation, alone or in combination with one or more of the first through fourth implementations, performing the annealing operation to fuse the first ALD bonding layer 224 and the second ALD bonding layer 226 and form the single ALD bonding 232 layer includes performing the annealing operation, at a temperature in a range from approximately one-hundred and fifty degrees Celsius to approximately four hundred degrees Celsius and for a time period in a range from approximately thirty minutes to approximately three hours, to fuse the first ALD bonding layer 224 and the second ALD bonding layer 226 and form the single ALD bonding layer 232.

In a sixth implementation, alone or in combination with one or more of the first through fifth implementations, a uniformity of each of the first ALD bonding layer 224 and the second ALD bonding layer 226 is in a range from approximately one percent to approximately two percent to enable direct bonding of the first semiconductor device 202 and the second semiconductor device 210. In a seventh implementation, alone or in combination with one or more of the first through sixth implementations, each of the first ALD bonding layer 224 and the second ALD bonding layer 226 includes a dielectric material.

In an eighth implementation, alone or in combination with one or more of the first through seventh implementations, each of the first ALD bonding layer 224 and the second ALD bonding layer 226 includes one or more of silicon, silicon nitride, silicon oxide, silicon dioxide, an organo-silicate glass, or a spin-on organic polymeric dielectric. In a ninth implementation, alone or in combination with one or more of the first through eighth implementations, the first semiconductor device 202 includes one of a first semiconductor wafer or a first semiconductor die, and the second semiconductor device 210 includes one of a second semiconductor wafer or a second semiconductor die.

In a tenth implementation, alone or in combination with one or more of the first through ninth implementations, each of the first ALD bonding layer 224 and the second ALD bonding layer 226 includes a ratio of silicon hydroxide and silicon monoxide in a range from approximately five percent to approximately twenty percent. In an eleventh implementation, alone or in combination with one or more of the first through tenth implementations, a nitrogen concentration between a surface of the first ALD bonding layer 224 and a surface of the second ALD layer 226 is less than two percent. In a twelfth implementation, alone or in combination with one or more of the first through eleventh implementations, the single ALD bonding layer 232 includes a ratio of silicon hydroxide and silicon monoxide in a range from approximately five percent to approximately twenty percent.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

FIGS. 5A-5E are diagrams of one or more example operations 500 involved in manufacturing an example semiconductor device described herein. In particular, the one or more example operations 500 may be performed to bond second semiconductor device 210 to a carrier substrate such as a silicon carrier wafer such that one or more additional operations (e.g., one or more backside operations) may be performed on second semiconductor device 210 while second semiconductor device 210 is supported by the carrier substrate.

Figure 5A:
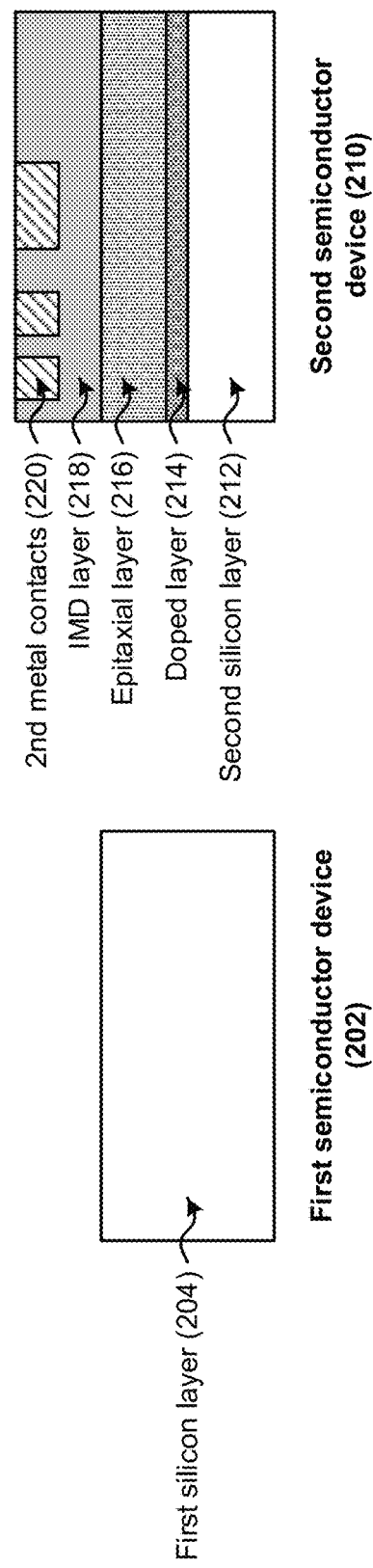
FIGS. 5A-5E are diagrams of one or more example operations involved in manufacturing an example semiconductor device described herein.

As shown in FIG. 5A, a first semiconductor device 202 may include first silicon layer 204. First silicon layer 204 may be a carrier substrate such as a silicon carrier wafer. As further shown in FIG. 5A, second semiconductor device 210 may include second silicon layer 212, doped layer 214 provided on second silicon layer 212, epitaxial layer 216 formed on doped layer 214, IMD layer 218 formed on epitaxial layer 216, and second metal contacts 220 formed in IMD layer 218. In some implementations, passivation layer 221 may also be formed on IMD layer 218 and second metal contacts 220.

Figure 5B:
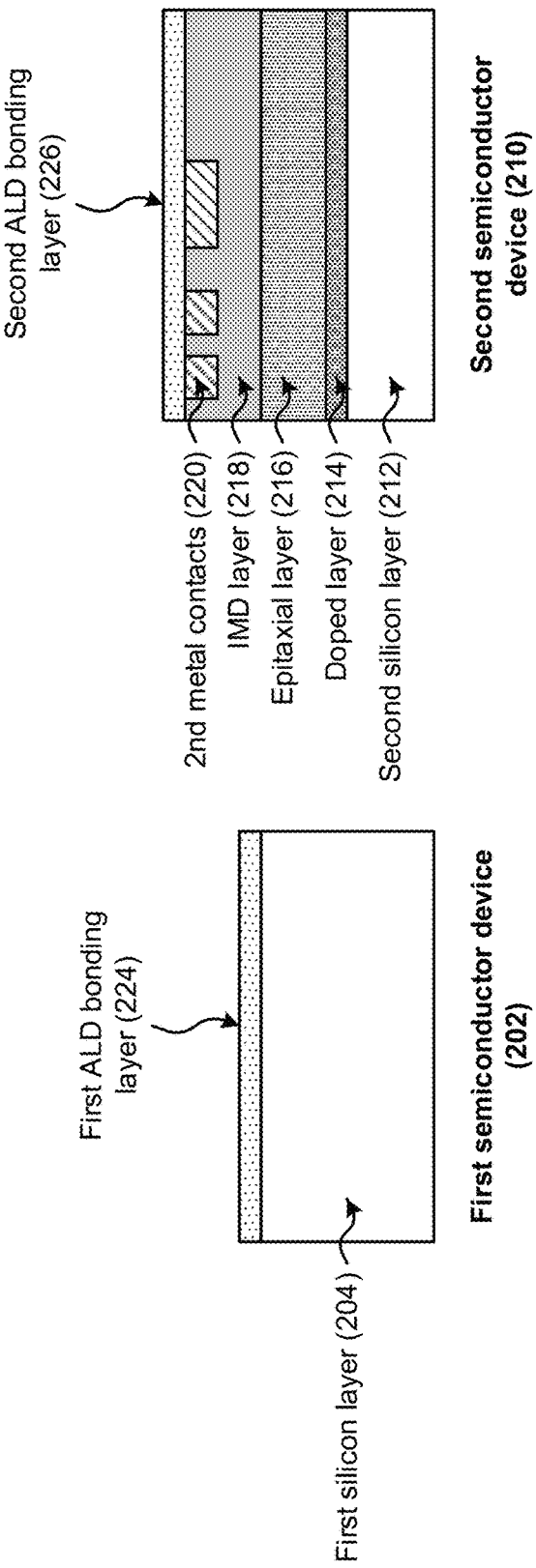

As shown in FIG. 5B, and by reference number 502, an ALD operation may be performed to form first ALD bonding layer 224 on a top surface of first semiconductor device 202 and second ALD bonding layer 226 on a top surface of second semiconductor device 210. For example, first ALD bonding layer 224 may be formed on the top surface of first silicon layer 204 (e.g., the carrier substrate), and second ALD bonding layer 226 may be formed on top surfaces of IMD layer 218 and second metal contacts 220. In some implementations, first ALD bonding layer 224 and second ALD bonding layer 226 each includes a thickness that enables maintaining control over surface uniformity and roughness of surfaces of first ALD bonding layer 224 and second ALD bonding layer 226, which decreases a material cost of first ALD bonding layer 224 and second ALD bonding layer 226. For example, first ALD bonding layer 224 and second ALD bonding layer 226 each may include a thickness in a range from approximately 10 Angstroms to approximately 200 Angstroms, which is much thinner than thicknesses of current bonding layers. As another example, the first ALD bonding layer 224 and/or the second ALD bonding layer 226 may each include a thickness in a range from approximately 20 Angstroms to approximately 50 angstroms. Each of first ALD bonding layer 224 and second ALD bonding layer 226 may include a dielectric material, such as silicon, silicon nitride, silicon oxide, silicon dioxide, an organo-silicate glass, a spin-on organic polymeric dielectric, and/or the like.

In some implementations, deposition tool 104 of environment 100, described above in connection with FIG. 1, may be utilized to form first ALD bonding layer 224 on the top surface of first semiconductor device 202 and second ALD bonding layer 226 on the top surface of second semiconductor device 210. For example, deposition tool 104 may perform the atomic layer deposition operation to form first ALD bonding layer 224 on the top surface of first semiconductor device 202 and second ALD bonding layer 226 on the top surface of second semiconductor device 210. In some implementations, the atomic layer deposition operation may be performed under particular process conditions to form first ALD bonding layer 224 on the top surface of first semiconductor device 202 and second ALD bonding layer 226 on the top surface of second semiconductor device 210.

For example, the atomic layer deposition operation may include a deposition operation the deposits each of first ALD bonding layer 224 and second ALD bonding layer 226 with a thickness that enables maintaining control over surface uniformity and roughness of surfaces of first ALD bonding layer 224 and second ALD bonding layer 226. In this way, the atomic layer deposition operation may decrease a material cost of first ALD bonding layer 224 and second ALD bonding layer 226.

Figure 5C:
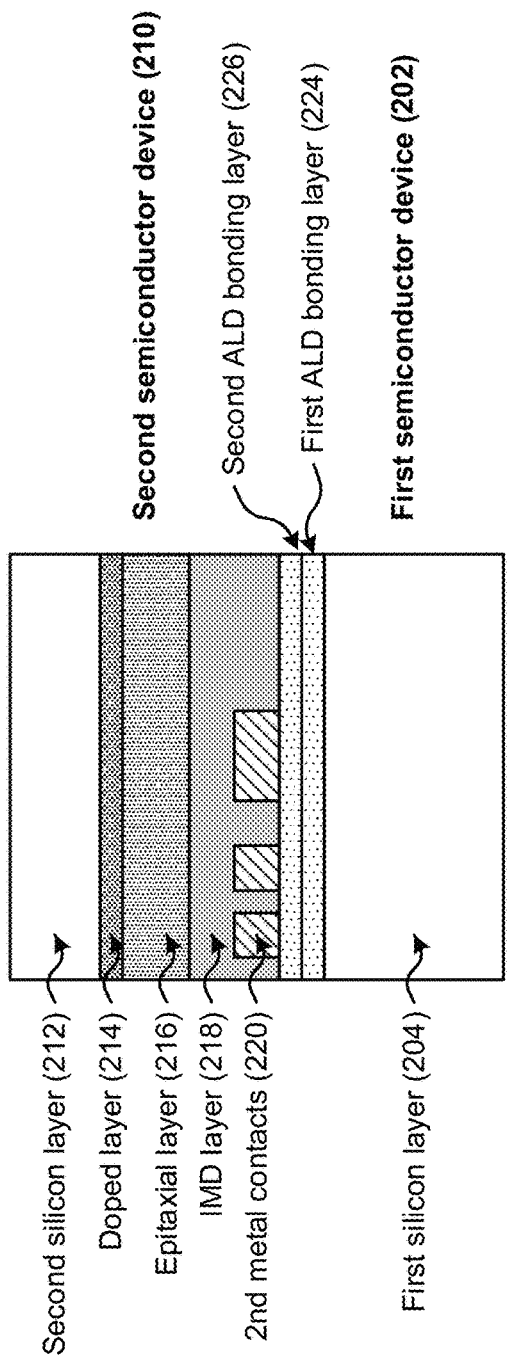

As shown in FIG. 5C, and by reference number 504, first semiconductor device 202 and second semiconductor device 210 may be joined via first ALD bonding layer 224 and second ALD bonding layer 226. For example, one of first semiconductor device 202 or second semiconductor device 210 may be rotated one-hundred and eighty degrees so that first ALD bonding layer 224 faces second ALD bonding layer 226. FIG. 5C shows second semiconductor device 210 being rotated one-hundred and eighty degrees, but first semiconductor device 202 may be rotated one-hundred and eighty degrees instead of second semiconductor device 210. Once first ALD bonding layer 224 faces second ALD bonding layer 226, first ALD bonding layer 224 may be joined together with second ALD bonding layer 226, which may join first semiconductor device 202 and second semiconductor device 210. Thus, as shown in the example orientation of FIG. 5C, second ALD bonding layer 226 may be provided on a top surface of first ALD bonding layer 224. Second metal contacts 220 and IMD layer 218 may be provided on second ALD bonding layer 226, and epitaxial layer 216 may be provided on IMD layer 218. Doped layer 214 may be provided on epitaxial layer 216, and second silicon layer 212 may be provided on doped layer 214. The first ALD bonding layer 224 and the second ALD bonding layer 226 may be joined without a CMP operation and without plasma treatment operation on the first ALD bonding layer 224 and the second ALD bonding layer 226 after formation of the first ALD bonding layer 224 and the second ALD bonding layer 226.

In some implementations, each of first ALD bonding layer 224 and second ALD bonding layer 226 includes a ratio of silicon hydroxide and silicon monoxide in a range from approximately five percent to approximately twenty percent to enable direct bonding of first semiconductor device 202 and second semiconductor device 210. A bonding strength of each of first ALD bonding layer 224 and second ALD bonding layer 226 may be greater than two Joules per square meter to enable direct bonding of first semiconductor device 202 and second semiconductor device 210. For example, the bonding strength of each of first ALD bonding layer 224 and second ALD bonding layer 226 may be approximately greater than 2.5 Joules per square meter. In some implementations, first semiconductor device 202 and second semiconductor device 210 are joined via first ALD bonding layer 224 and second ALD bonding layer 226 without pretreating first ALD bonding layer 224 and second ALD bonding layer 226. The bonding strength of first ALD bonding layer 224 and second ALD bonding layer 226 eliminates a need for expensive and time consuming plasma pretreatment utilized in current bonding processes.

In some implementations, a uniformity of each of first ALD bonding layer 224 and second ALD bonding layer 226 is in a range from approximately one percent to approximately two percent to enable direct bonding of first semiconductor device 202 and second semiconductor device 210. In some implementations, a nitrogen concentration between a surface of first ALD bonding layer 224 and a surface of second ALD bonding layer 226 is less than two percent (e.g., at the bonding interface between the first ALD layer 224 and the second ALD layer 226) to enable direct bonding of first semiconductor device 202 and second semiconductor device 210. The uniformity and the nitrogen concentration associated with first ALD bonding layer 224 and second ALD bonding layer 226 eliminates a need for expensive and time consuming chemical mechanical polishing planarization utilized in current bonding processes.

In some implementations, first ALD bonding layer 224 or second ALD bonding layer 226 may be omitted and a single ALD bonding layer may be provided on the top surface of first semiconductor device 202 or on the top surface of second semiconductor device 210. In such implementations, first semiconductor device 202 and second semiconductor device 210 may be joined together by the single ALD bonding layer. The single ALD bonding layer may include the properties described above in connection with first ALD bonding layer 224 and/or second ALD bonding layer 226.

After forming the first ALD bonding layer 224 and the second ALD bonding layer 226, no CMP operation and no plasma treatment operation is performed on the first ALD bonding layer 224 and the second ALD bonding layer 226. CMP and plasma treatment may increase the surface roughness of the first ALD bonding layer 224 and the second ALD bonding layer 226, which would decrease direct bonding performance between the first ALD bonding layer 224 and the second ALD bonding layer 226. For example, an average root means square surface roughness (Rq) of the first ALD bonding layer 224 and the second ALD bonding layer 226 after CMP may be approximately 1 Angstrom, whereas the Rq of the first ALD bonding layer 224 and the second ALD bonding layer 226 after ALD deposition without CMP and without plasma treatment may be less than 1 Angstrom. In particular, the Rq of the first ALD bonding layer 224 and the second ALD bonding layer 226 after ALD deposition without CMP and without plasma treatment may be in a range of approximately 0.75 Angstroms for a layer thickness of approximately 25 Angstroms to less than 1 Angstrom for a layer thickness of approximately 100 Angstroms.

Figure 5D:
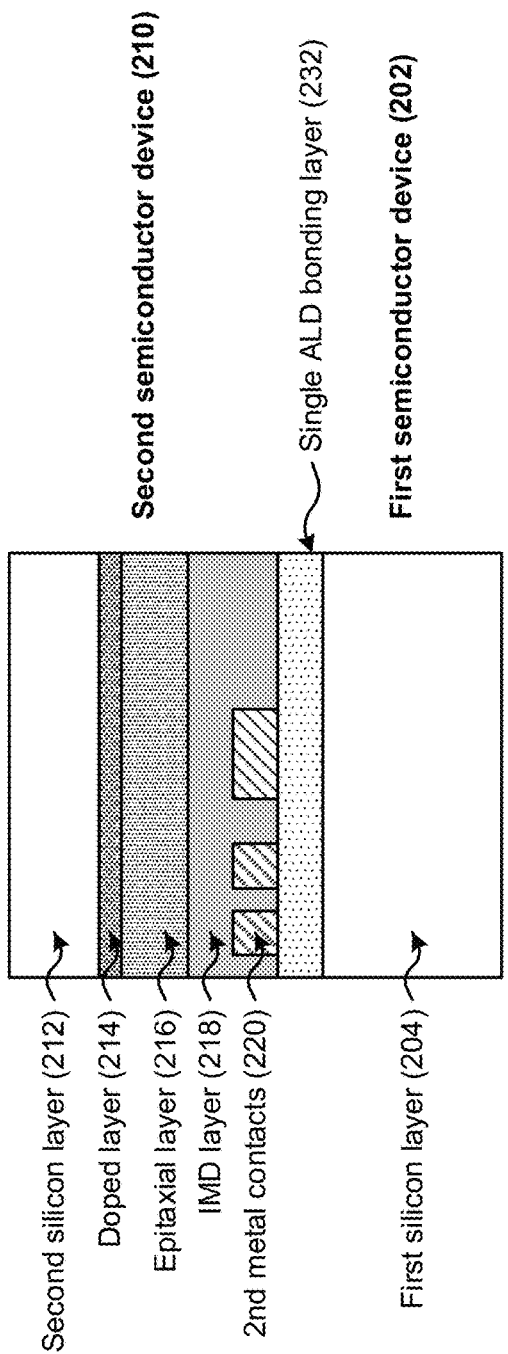

As shown in FIG. 5D, and by reference number 506, an annealing operation may be performed to fuse first ALD bonding layer 224 and second ALD bonding layer 226 and form a single ALD bonding layer 232. Single ALD bonding layer 232 may include the properties described above in connection with first ALD bonding layer 224 and/or second ALD bonding layer 226 since single ALD bonding layer 232 is formed from fusing together first ALD bonding layer 224 and second ALD bonding layer 226. In some implementations, single ALD bonding layer 232 includes a ratio of silicon hydroxide and silicon monoxide in a range from approximately five percent to approximately twenty percent to enable direct bonding of first ALD bonding layer 224 and second ALD bonding layer 226 to form single ALD bonding layer 232.

In some implementations, annealing tool 106 of environment 100, described above in connection with FIG. 1, may be utilized to perform the annealing operation to fuse first ALD bonding layer 224 and second ALD bonding layer 226 (e.g., through covalent bonding of first ALD bonding layer 224 and second ALD bonding layer 226) and form single ALD bonding layer 232. In some implementations, the annealing operation may be performed under particular process conditions to fuse first ALD bonding layer 224 and second ALD bonding layer 226 and form single ALD bonding layer 232. For example, the annealing operation may be performed at a temperature in a range from approximately one-hundred and fifty degrees Celsius to approximately four hundred degrees Celsius and for a time period in a range from approximately thirty minutes to approximately three hours, to fuse first ALD bonding layer 224 and second ALD bonding layer 226 and form single ALD bonding layer 232.

Figure 5E:
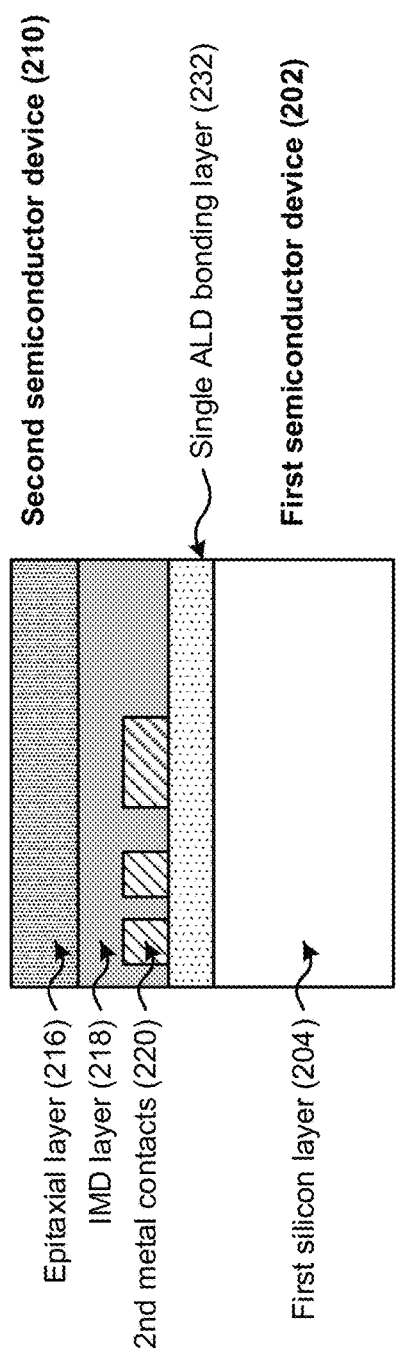

As shown in FIG. 5E, and by reference number 508, an etching operation may be performed to remove second silicon layer 212 and doped layer 214 from epitaxial layer 216. In some implementations, a first etching operation is performed to remove second silicon layer 212 from doped layer 214, and a second etching operation is performed to remove doped layer 214 from epitaxial layer 216. In some implementations, etch tool 110 of environment 100, described above in connection with FIG. 1, may be utilized to perform the first etching operation to remove second silicon layer 212 from doped layer 214, and to perform the second etching operation to remove doped layer 214 from epitaxial layer 216. In some implementations, a single etching operation is performed to remove second silicon layer 212 and doped layer 214 from epitaxial layer 216.

In this way, the annealing operation described above in connection with reference number 506 may be performed to bond second semiconductor device 210 to a carrier substrate such as a silicon carrier wafer (e.g., first silicon layer 204) such that one or more additional operations (e.g., one or more backside operations) may be performed on second semiconductor device 210 while second semiconductor device 210 is supported by the carrier substrate.

As indicated above, FIGS. 5A-5E are provided merely as one or more examples. Other examples may differ from what is described with regard to FIGS. 5A-5E.

FIG. 6 is a flow chart of an example process 600 for utilizing an ALD bonding layer to join two semiconductor devices. In some implementations, one or more process blocks of FIG. 6 may be performed by a device (e.g., one or more of the tools depicted in FIG. 1). In some implementations, one or more process blocks of FIG. 6 may be performed by another device or a group of devices separate from or including the one or more tools depicted in FIG. 1. Additionally, or alternatively, one or more process blocks of FIG. 6 may be performed by one or more components of device 300, such as processor 320, memory 330, storage component 340, input component 350, output component 360, communication component 370, and/or the like.

As shown in FIG. 6, process 600 may include forming a first ALD bonding layer over a carrier substrate of a first semiconductor device (block 610). For example, the device may form first ALD bonding layer 224 over a carrier substrate of a first semiconductor device 202, as described above. The carrier substrate includes a first silicon layer 204 such as a silicon carrier wafer.

As further shown in FIG. 6, process 600 may include forming a second ALD bonding layer on a surface of a second semiconductor device (block 620). For example, the device may form a second ALD bonding layer 226 on a surface of a second semiconductor device 210, as described above.

As further shown in FIG. 6, process 600 may include joining the first semiconductor device and the second semiconductor device via the first ALD bonding layer and the second ALD bonding layer (block 630). For example, the device may join the first semiconductor device 202 and the second semiconductor device 210 via the first ALD bonding layer 224 and the second ALD bonding layer 226, as described above.

As further shown in FIG. 6, process 600 may include performing an annealing operation to fuse the first ALD bonding layer and the second ALD bonding layer and form a single ALD bonding layer that bonds the first semiconductor device with the second semiconductor device (block 640). For example, the device may perform an annealing operation to fuse the first ALD bonding layer 224 and the second ALD bonding layer 226 and form a single ALD bonding layer 232 that bonds the first semiconductor device 202 with the second semiconductor device 210, as described above.

As further shown in FIG. 6, process 600 may include removing a silicon layer and a doped layer from the second semiconductor device after performing the annealing operation (block 650). For example, the device may remove the second silicon layer 212 and a doped layer 214 from the second semiconductor device 210 after performing the annealing operation, as described above.

Process 600 may include additional implementations, such as any single implementation or any combination of implementations described below and/or in connection with one or more other processes described elsewhere herein. Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, a method may include utilizing ALD bonding layers 224 and 226 to join first semiconductor device 202 and second semiconductor device 210. ALD bonding layers 224 and 226 may be formed as thin bonding layers (e.g., rather than thick bonding layers) while maintaining control over surface uniformity and roughness of surfaces of ALD bonding layers 224 and 226, which decreases a material cost of ALD bonding layers 224 and 226. Moreover, first semiconductor device 202 may be bonded to second semiconductor device 210 using ALD bonding layers 224 and 226 and without having to planarize and pretreat ALD bonding layers 224 and 226 prior to bonding, which decreases a cost and a complexity of the bonding process and prevents formation of planarization slurry residue on ALD bonding layers 224 and 226.

As described in greater detail above, some implementations described herein provide a method for manufacturing a device. The method may include forming a first atomic layer deposition (ALD) bonding layer on a surface of a first semiconductor device, and forming a second ALD bonding layer on a surface of a second semiconductor device. The method may include joining the first semiconductor device and the second semiconductor device via the first ALD bonding layer and the second ALD bonding layer, and performing an annealing operation to fuse the first ALD bonding layer and the second ALD bonding layer and form a single ALD bonding layer that bonds the first semiconductor device with the second semiconductor device. A nitrogen concentration at a bonding interface between the first ALD bonding layer and the second ALD bonding layer is less than approximately 2 percent As described in greater detail above, some implementations described herein provide a device. The device may include a first semiconductor device, a second semiconductor device, and an atomic layer deposition (ALD) bonding layer joining the first semiconductor device and the second semiconductor device. The ALD bonding layer may include a thickness in a range from approximately ten Angstroms to approximately two hundred Angstroms, and the ALD bonding layer includes a ratio of silicon hydroxide and silicon monoxide in a range from approximately five percent to approximately twenty percent.

As described in greater detail above, some implementations described herein provide a method for manufacturing a device. The method may include forming a first atomic layer deposition (ALD) bonding layer on a surface of a first semiconductor device, and forming a second ALD bonding layer on a surface of a second semiconductor device. The method may include bonding the first semiconductor device and the second semiconductor device via the first ALD bonding layer and the second ALD bonding layer, and performing an annealing operation to fuse the first ALD bonding layer and the second ALD bonding layer and form a single ALD bonding layer with a thickness in a range from approximately 20 Angstroms to approximately 400 Angstroms.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that those skilled in the art may make various changes, substitutions, and alterations herein without departing from the spirit and scope of the present disclosure.

What is claimed is:

1. A method for manufacturing a device, the method comprising:
   forming a first atomic layer deposition (ALD) bonding layer;
   forming a second ALD bonding layer, the first ALD bonding layer is formed only on a surface of a first passivation layer, of a first semiconductor device, comprised entirely of an oxide material, and the second ALD bonding layer is formed only on a surface of a second passivation layer, of a second semiconductor device, comprised entirely of the oxide material;
   joining the first semiconductor device and the second semiconductor device via the first ALD bonding layer and the second ALD bonding layer;
   performing an annealing operation to fuse the first ALD bonding layer and the second ALD bonding layer and to form a single ALD bonding layer that bonds the first semiconductor device with the second semiconductor device,
      wherein a nitrogen concentration at a bonding interface between the first ALD bonding layer and the second ALD bonding layer is less than approximately 2 percent; and
   forming a first metal via, entirely through a first portion of the single ALD bonding layer of the first semiconductor device and connecting to a first metal contact in the second semiconductor device, and a second metal via, entirely through a second portion of the single ALD bonding layer of the first semiconductor device and connecting to a second metal contact in the second semiconductor device, wherein the first metal via and the second metal via are formed entirely through the first semiconductor device, and
      wherein the first portion of the single ALD bonding layer is spaced from the second portion of the single ALD bonding layer, and the first metal contact in the second semiconductor device is spaced from the second metal contact in the second semiconductor device.

2. The method of claim 1, wherein the first ALD bonding layer and the second ALD bonding layer each includes a thickness in a range from approximately 10 Angstroms to approximately 200 Angstroms.

3. The method of claim 1, wherein joining the first semiconductor device and the second semiconductor device via the first ALD bonding layer and the second ALD bonding layer comprises:
   joining the first semiconductor device and the second semiconductor device via the first ALD bonding layer and the second ALD bonding layer without planarizing the first ALD bonding layer or the second ALD bonding layer.

4. The method of claim 1, wherein a bonding strength of the first ALD bonding layer or the second ALD bonding layer is greater than two Joules per square meter to enable direct bonding of the first semiconductor device and the second semiconductor device.

5. The method of claim 1, wherein joining the first semiconductor device and the second semiconductor device via the first ALD bonding layer and the second ALD bonding layer comprises:
   joining the first semiconductor device and the second semiconductor device via the first ALD bonding layer and the second ALD bonding layer without pretreating the first ALD bonding layer and the second ALD bonding layer.

6. The method of claim 1, wherein performing the annealing operation to fuse the first ALD bonding layer and the second ALD bonding layer and form the single ALD bonding layer comprises:
   performing the annealing operation, at a temperature in a range from approximately one-hundred and fifty degrees Celsius to approximately four hundred degrees Celsius and for a time period in a range from approximately thirty minutes to approximately three hours, to fuse the first ALD bonding layer and the second ALD bonding layer and form the single ALD bonding layer.

7. The method of claim 1, wherein a uniformity of the first ALD bonding layer or the second ALD bonding layer is in a range from approximately one percent to approximately two percent to enable direct bonding of the first semiconductor device and the second semiconductor device.

8. A method for manufacturing a device, the method comprising:
   forming a first atomic layer deposition (ALD) bonding layer;
   forming a second ALD bonding layer,
      the first ALD bonding layer is formed only on a surface of a first passivation layer of a first semiconductor device, and
      the second ALD bonding layer is formed only on a surface of a second passivation layer of a second semiconductor device;
   joining the first semiconductor device and the second semiconductor device via the first ALD bonding layer and the second ALD bonding layer;
   performing an annealing operation to fuse the first ALD bonding layer and the second ALD bonding layer and to form a single ALD bonding layer that bonds the first semiconductor device with the second semiconductor device; and
   forming a first metal via, entirely through a first portion of the single ALD bonding layer and connecting to a first metal contact in the second semiconductor device, and a second metal via, entirely through a second portion of the single ALD bonding layer and connecting to a second metal contact in the second semiconductor device, wherein the first metal via and the second metal via are formed entirely through the first semiconductor device, and wherein the first portion of the single ALD bonding layer is spaced from the second portion of the single ALD bonding layer, and the first metal contact in the second semiconductor device is spaced from the second metal contact in the second semiconductor device.

9. The method of claim 8, wherein the second semiconductor device is one of a second semiconductor wafer or a second semiconductor die.

10. The method of claim 8, wherein a nitrogen concentration between a surface of the first ALD bonding layer and a surface of the second ALD layer is less than two percent.

11. The method of claim 8, wherein joining the first semiconductor device and the second semiconductor device via the first ALD bonding layer and the second ALD bonding layer comprises:
bonding the first semiconductor device and the second semiconductor device via the first ALD bonding layer and the second ALD bonding layer without pretreating the first ALD bonding layer and the second ALD bonding layer.

12. The method of claim 8, wherein joining the first semiconductor device and the second semiconductor device via the first ALD bonding layer and the second ALD bonding layer comprises:
bonding the first semiconductor device and the second semiconductor device via the first ALD bonding layer and the second ALD bonding layer without planarizing the first ALD bonding layer and the second ALD bonding layer.

13. The method of claim 8, wherein at least one of the first ALD bonding layer or the second bonding ALD bonding layer includes a ratio of silicon hydroxide and silicon monoxide in a range from approximately five percent to approximately twenty percent.

14. A method for manufacturing a device, the method comprising:
providing a first semiconductor device comprising a first silicon layer, a doped layer on the first silicon layer, an epitaxial layer on the doped layer, a intermetal dielectric (IMD) layer on the epitaxial layer, and a first passivation layer on the IMD layer;
providing a second semiconductor device comprising a second silicon layer, an undoped silicate glass (USG) layer on the second silicon layer, and a second passivation layer on the USG layer,
wherein each of the first passivation layer and the second passivation layer is comprised entirely of an oxide material;
forming a first atomic layer deposition (ALD) bonding layer on the first passivation layer of the first semiconductor device;
forming a second ALD bonding layer on the second passivation layer of the first semiconductor device, wherein: the first ALD bonding layer is formed only on a surface of the first passivation layer of the first semiconductor device, and the second ALD bonding layer is formed only on a surface of the second passivation layer of the second semiconductor device;
joining the first semiconductor device and the second semiconductor device via the first ALD bonding layer and the second ALD bonding layer;
performing an annealing operation to fuse the first ALD bonding layer and the second ALD bonding layer and to form a single ALD bonding layer that bonds the first semiconductor device with the second semiconductor device;
performing an etching process to remove the first silicon layer and the doped layer of the first semiconductor device;
forming a first metal via, entirely through a first portion of the single ALD bonding layer of the first semiconductor device and connecting to a first metal contact in the second semiconductor device; and
forming a second metal via, entirely through a second portion of the single ALD bonding layer of the first semiconductor device and connecting to a second metal contact in the second semiconductor device,
wherein the first metal via and the second metal via are formed entirely through the epitaxial layer, the IMD layer and the first passivation layer of the first semiconductor device, and
wherein the first portion of the single ALD bonding layer is spaced from the second portion of the single ALD bonding layer, and the first metal contact in the second semiconductor device is spaced from the second metal contact in the second semiconductor device.

15. The method of claim 14, wherein a uniformity of the single ALD bonding layer is in a range from approximately one percent to approximately two percent to enable direct bonding of the first semiconductor device and the second semiconductor device.

16. The method of claim 14, wherein the single ALD bonding layer includes a dielectric material.

17. The method of claim 14, wherein the single ALD bonding layer includes one or more of:
silicon,
silicon nitride,
silicon oxide,
silicon dioxide,
an organo-silicate glass, or
a spin-on organic polymeric dielectric.

18. The method of claim 14, wherein the first semiconductor device includes one of a first semiconductor wafer or a first semiconductor die, and the second semiconductor device includes one of a second semiconductor wafer or a second semiconductor die.

19. The method of claim 14, wherein a ratio of a thickness of the first semiconductor device and a thickness of the second semiconductor device is in a range of approximately 5 percent to approximately 30 percent.

20. The method of claim 14, wherein a bonding strength of the single ALD bonding layer is greater than two Joules per square meter to enable direct bonding of the first semiconductor device and the second semiconductor device.

* * * * *

UNITED STATES PATENT AND TRADEMARK OFFICE
CERTIFICATE OF CORRECTION

| | |
|---|---|
| PATENT NO. | : 12,094,849 B2 |
| APPLICATION NO. | : 17/443186 |
| DATED | : September 17, 2024 |
| INVENTOR(S) | : Kuang-Wei Cheng et al. |

Page 1 of 1

It is certified that error appears in the above-identified patent and that said Letters Patent is hereby corrected as shown below:

In the Claims

Claim 13:
Column 21, Line 39, change "ALD bonding layer or the second bonding ALD bonding" to -- ALD bonding layer or the second ALD bonding --

Signed and Sealed this
Twenty-second Day of April, 2025

Coke Morgan Stewart
*Acting Director of the United States Patent and Trademark Office*